US010912186B2

(12) United States Patent
Sato et al.

(10) Patent No.: US 10,912,186 B2
(45) Date of Patent: Feb. 2, 2021

(54) SEMICONDUCTOR DEVICE

(71) Applicant: MITSUBISHI ELECTRIC CORPORATION, Tokyo (JP)

(72) Inventors: Shota Sato, Tokyo (JP); Tsuneo Hamaguchi, Tokyo (JP); Yuji Shirakata, Tokyo (JP); Kenta Fujii, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/778,388

(22) PCT Filed: Nov. 28, 2016

(86) PCT No.: PCT/JP2016/085205
§ 371 (c)(1),
(2) Date: May 23, 2018

(87) PCT Pub. No.: WO2017/094670
PCT Pub. Date: Jun. 8, 2017

(65) Prior Publication Data
US 2018/0343736 A1    Nov. 29, 2018

(30) Foreign Application Priority Data

Dec. 3, 2015   (JP) .................................. 2015-236688

(51) Int. Cl.
*H05K 1/02* (2006.01)
*H05K 1/03* (2006.01)
(Continued)

(52) U.S. Cl.
CPC ....... *H05K 1/0206* (2013.01); *H01L 23/3677* (2013.01); *H01L 23/3737* (2013.01);
(Continued)

(58) Field of Classification Search
CPC ................. H05K 1/0206; H05K 7/205; H05K 2201/0209; H05K 2201/09572;
(Continued)

(56) References Cited

U.S. PATENT DOCUMENTS 5,258,887 A * 11/1993 Fortune ............... H01L 23/3736
174/252
5,792,677 A * 8/1998 Reddy ................. H01L 23/3677
257/712

(Continued)

FOREIGN PATENT DOCUMENTS

DE    197 23 409 A1    12/1998
DE    101 27 268 A1    4/2002
(Continued)

OTHER PUBLICATIONS

International Search Report (PCT/ISA/210) dated Feb. 7, 2017, by the Japanese Patent Office as the International Searching Authority for International Application No. PCT/JP2016/085205.
(Continued)

*Primary Examiner* — Stephen S Sul
(74) *Attorney, Agent, or Firm* — Buchanan Ingersoll & Rooney PC

(57) ABSTRACT

A printed board includes an insulating layer, and radiation vias penetrating printed board are formed in both a first region overlapping electronic component and a second region outside the first region. A plurality of conductor layers included in printed board are cross-connected to a plurality of radiation vias. Diffusion radiator includes a thermal diffusion plate, a radiation member, and a cooling body. Radiation member is in close contact with one of main surfaces of cooling body, and thermal diffusion plate is in close contact with one of main surfaces of radiation member on the opposite side to cooling body. One of main surfaces of thermal diffusion plate on the opposite side to radiation
(Continued)

member is bonded to a conductor layer on the other main surface of printed board so as to close the plurality of radiation vias.

13 Claims, 17 Drawing Sheets

(51) Int. Cl.
    H05K 1/18        (2006.01)
    H05K 7/20        (2006.01)
    H01L 23/367      (2006.01)
    H01L 23/373      (2006.01)
    H01L 23/498      (2006.01)

(52) U.S. Cl.
    CPC .......... *H05K 7/205* (2013.01); *H01L 23/3731* (2013.01); *H01L 23/49822* (2013.01); *H01L 23/49827* (2013.01); *H05K 1/0373* (2013.01); *H05K 1/181* (2013.01); *H05K 2201/0209* (2013.01); *H05K 2201/066* (2013.01); *H05K 2201/09572* (2013.01); *H05K 2201/10166* (2013.01); *H05K 2201/10628* (2013.01); *H05K 2201/10757* (2013.01)

(58) Field of Classification Search
    CPC .......... H05K 2201/10757; H05K 2201/10628; H05K 2201/10166; H05K 2201/066; H05K 1/181; H05K 1/0373; H01L 23/3737; H01L 23/3677; H01L 23/49822; H01L 23/49527; H01L 23/3731
    USPC .................................. 361/709, 710, 720
    See application file for complete search history.

(56) References Cited

U.S. PATENT DOCUMENTS

| | | | |
|---|---|---|---|
| 2002/0047193 A1 | 4/2002 | Dorfler et al. | |
| 2004/0048414 A1 | 3/2004 | Heinz et al. | |
| 2005/0063162 A1* | 3/2005 | Barcley | H05K 1/0206 |
| | | | 361/720 |
| 2005/0077614 A1* | 4/2005 | Chengalva | H01L 25/0655 |
| | | | 257/706 |
| 2005/0236180 A1* | 10/2005 | Sarma | H01L 23/15 |
| | | | 174/256 |
| 2006/0180821 A1* | 8/2006 | Fan | F21K 9/00 |
| | | | 257/98 |
| 2008/0111151 A1 | 5/2008 | Teraki et al. | |
| 2009/0294165 A1* | 12/2009 | Thomas | H05K 3/0094 |
| | | | 174/263 |
| 2010/0254093 A1 | 10/2010 | Oota et al. | |
| 2013/0021769 A1* | 1/2013 | Fukuzono | H01L 23/4006 |
| | | | 361/783 |
| 2013/0314920 A1* | 11/2013 | Park | H01L 23/3677 |
| | | | 362/249.02 |
| 2014/0080940 A1 | 3/2014 | Lee et al. | |
| 2014/0150839 A1* | 6/2014 | Hershberger | H01L 23/38 |
| | | | 136/205 |
| 2015/0092374 A1* | 4/2015 | Isaacs | H05K 1/0206 |
| | | | 361/767 |
| 2015/0173168 A1* | 6/2015 | Jiang | H05K 1/0209 |
| | | | 361/720 |
| 2015/0255380 A1* | 9/2015 | Chen | H01L 23/49568 |
| | | | 361/707 |
| 2015/0257249 A1* | 9/2015 | Kim | H05K 1/0204 |
| | | | 361/700 |
| 2015/0318237 A1* | 11/2015 | Narag | H01L 33/62 |
| | | | 357/99 |
| 2015/0319840 A1* | 11/2015 | Sanada | H01L 23/13 |
| | | | 361/709 |
| 2016/0088720 A1* | 3/2016 | Willis | H01L 23/3677 |
| | | | 361/709 |
| 2016/0183405 A1* | 6/2016 | Sanada | H01L 23/13 |
| | | | 361/694 |
| 2017/0280552 A1* | 9/2017 | Wiesa | H05K 1/0204 |

FOREIGN PATENT DOCUMENTS

| | | |
|---|---|---|
| DE | 101 01 359 A1 | 7/2002 |
| DE | 102004021810 A1 | 12/2005 |
| DE | 10 2010 016 279 A1 | 11/2010 |
| EP | 2129197 A1 | 12/2009 |
| JP | S62-007192 A | 1/1987 |
| JP | H06-077679 A | 3/1994 |
| JP | H11-345921 A | 12/1999 |
| JP | 2004-006791 A | 1/2004 |
| JP | 2004-228349 A | 8/2004 |
| JP | 2005-072104 A | 3/2005 |
| JP | 2005-136347 A | 5/2005 |
| JP | 2006-196853 A | 7/2006 |
| JP | 2007-208123 A | 8/2007 |
| JP | 2008-091527 A | 4/2008 |
| JP | 2009-200234 A | 9/2009 |
| JP | 4469429 B2 | 5/2010 |
| JP | 2013-165244 A | 8/2013 |
| JP | 2013-232654 A | 11/2013 |

OTHER PUBLICATIONS

Written Opinion (PCT/ISA/237) dated Feb. 7, 2017, by the Japanese Patent Office as the International Searching Authority for International Application No. PCT/JP2016/085205.

Office Action (Notice of Reasons for Refusal) dated Apr. 9, 2019, by the Japan Patent Office in corresponding Japanese Patent Application No. 2017-553845 and English translation of the Office Action. (23 pages).

Office Action dated Apr. 16, 2020, by the German Patent Office in corresponding German Patent Application No. 112016005508.0 and English translation of the Office Action. (16 pages).

The First Office Action issued by The State Intellectual Property Office of People's Republic of China in corresponding Chinese Patent Application No. 201680069592.X dated Sep. 27, 2020 (24 pages including partial English translation).

Office Action dated Oct. 26, 2020, by the German Patent Office in corresponding German Patent Application No. 112016005508.0. (10 pages).

\* cited by examiner

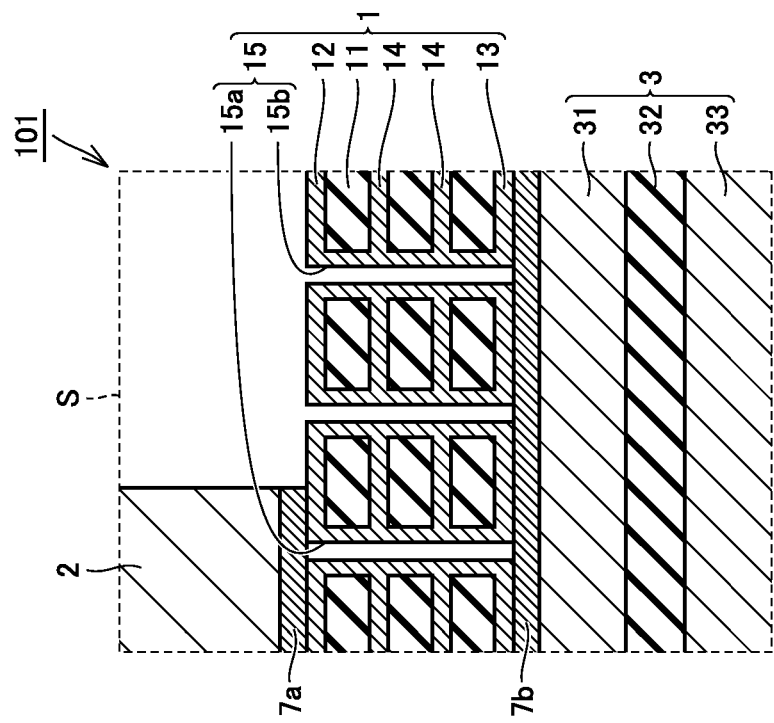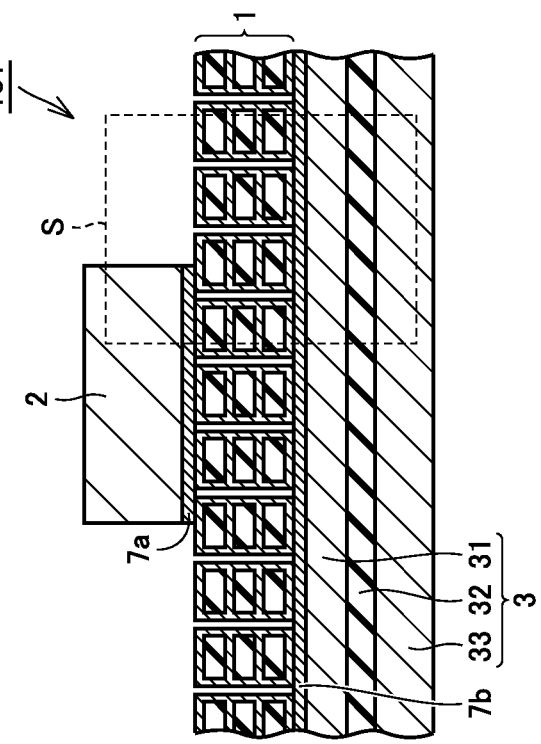

SEMICONDUCTOR DEVICE

TECHNICAL FIELD

The present invention relates to a semiconductor device, particularly to a semiconductor device that radiates heat generated by electronic components on a printed board through a radiation member.

BACKGROUND ART

In recent years, semiconductor devices used in an on-board or vehicle large-capacity industrial equipment tend to be multifunctional, high output, and low-profile. As a result, an amount of heat generated per unit volume of the electronic component mounted on the semiconductor device is largely increased, and there is a strong demand for a semiconductor device enabling high radiation.

For example, Japanese Patent Laying-Open Nos. 6-77679 (PTD 1) and 11-345921 (PTD 2) disclose a semiconductor device that radiates the heat generated from electronic components. In these PTDs, electronic components are bonded in an upper portion of a printed circuit board while a heat sink is bonded in a lower portion. A thermal conduction channel is formed in the printed circuit board so as to penetrate the printed circuit board from one of main surfaces to the other main surface. The heat generated from the electronic components is transferred to the heat sink through the thermal conduction channel, and can be radiated from the heat sink to the outside.

CITATION LIST

Patent Document

PTD 1: Japanese Patent Laying-Open No. 6-77679
PTD 2: Japanese Patent Laying-Open No. 11-345921

SUMMARY OF INVENTION

Technical Problems

In the apparatus of Japanese Patent Laying-Open No. 6-77679, the thermal conduction channel is provided only in a portion of the printed circuit board away from immediately below the electronic component. In the apparatus of Japanese Patent Laying-Open No. 11-345921, a thermal conduction hole is made only immediately below the electronic component. In either case, because of a small area of a heat transferable region of the printed circuit board and a small amount of heat that can be conducted from the electronic component, the heat radiation is insufficient in the region from the electronic component to the heat sink below the electronic component.

An object of the present invention is to provide a semiconductor device, which can radially diffuse the heat around the electronic component and improve the heat radiation of the heat generated from the electronic component.

Solutions to Problems

A semiconductor device of the present invention includes a printed board, an electronic component on the printed board, and a diffusion radiator below the printed board. The printed board includes an insulating layer, and radiation vias penetrating the printed board are formed in both a first region overlapping the electronic component and a second region outside the first region. A plurality of conductor layers included in the printed board are cross-connected to each of the plurality of radiation vias. One of the plurality of conductor layers is disposed on the other main surface of the printed board. The diffusion radiator includes a thermal diffusion plate, a radiation member, and a cooling body. The radiation member is in close contact with one of main surfaces of the cooling body, and the thermal diffusion plate is in close contact with one of main surfaces of the radiation member on the opposite side to the cooling body. One of main surfaces of the thermal diffusion plate on the opposite side to the radiation member is bonded to the conductor layer on the other main surface of the printed board so as to close the plurality of radiation vias formed in the first region and the plurality of radiation vias formed in the second region.

Advantageous Effects of Invention

Accordingly, the present invention can provide the semiconductor device, which can radially diffuse the heat around the electronic component and improve the heat radiation of the heat generated from the electronic component.

BRIEF DESCRIPTION OF DRAWINGS

FIG. 2(A) is a schematic sectional view taken along line IIA-IIA in FIG. 1, and

FIG. 2(B) is an enlarged schematic sectional view illustrating a region S surrounded by a dotted line in FIG. 2(A) in the first example of the first embodiment.

FIG. 17 is a schematic diagram illustrating a planar aspect when the semiconductor device of the second embodiment is seen through.

DESCRIPTION OF EMBODIMENTS

Hereinafter, an embodiment will be described with reference to the drawings.

First Embodiment

Figure 1:
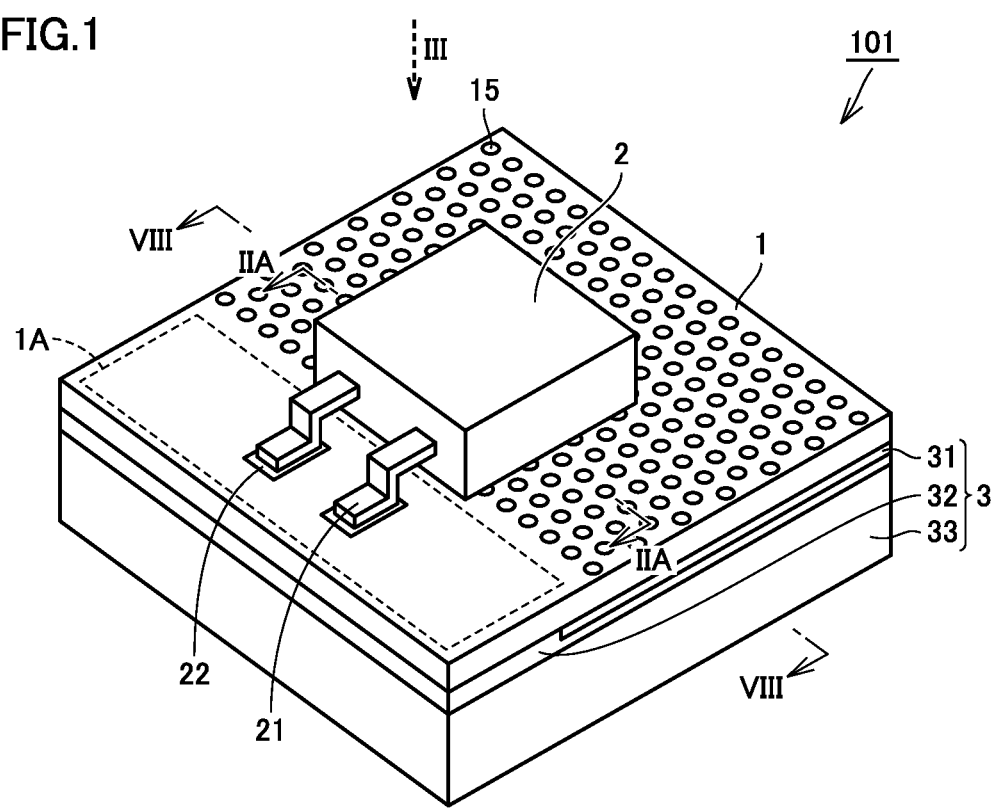
FIG. 1 is a schematic perspective view of a semiconductor device according to a first example of a first embodiment.

FIG. 1 illustrates an appearance aspect of a whole or part of a semiconductor device according to a first example of a first embodiment. That is, when FIG. 1 is a part of a semiconductor device, FIG. 1 illustrates only a part of the whole semiconductor device cut out. Referring to FIG. 1, a semiconductor device 101 according to a first example of the first embodiment is an apparatus used in a power conversion device mounted on a hybrid car, an electric car, or the like. Semiconductor device 101 mainly includes a printed board 1, an electronic component 2, and a diffusion radiator 3. Heat generated in electronic component 2 is transferred to diffusion radiator 3 through printed board 1, and is cooled by a cooling body 33 (to be described later) included in diffusion radiator 3.

Printed board 1 for connecting electronic component 2 and the like by way of wiring is formed in semiconductor device 101. In printed board 1, a plurality of radiation vias 15 penetrating from one of main surfaces indicated by a rectangle in FIG. 1 to the other main surface opposed to the one of main surfaces are formed at intervals. A partial region 1A surrounded by a dotted line on the one of the main surfaces of printed board 1 is a region where wiring (not illustrated) connected to a lead terminal 21 of electronic component 2 to be bonded on printed board 1 is to be placed. The wiring electrically connects electronic component 2 and another component. For this reason, radiation via 15 is not provided in region 1A. However, the present invention is not particularly limited thereto. Note that lead terminal 21 is bonded to an electrode 22 provided in a part of region 1A of printed board 1.

Electronic component 2 is a package in which a semiconductor chip including a MOSFET (Metal Oxide Semiconductor Field Effect Transistor) or an IGBT (Insulated Gate Bipolar Transistor) is sealed by resin. Because the semiconductor chip is included, a heating value of electronic component 2 is very large.

Diffusion radiator 3 includes a thermal diffusion plate 31, a radiation member 32, and cooling body 33. Thermal diffusion plate 31, radiation member 32, and cooling body 33 are laminated in this order from the upper side, namely, the side closer to electronic component 2 toward the lower side. Radiation member 32 and cooling body 33 are disposed in the substantially whole region overlapping radiation vias 15 at a transmission viewpoint from the side of the one of main surfaces (the upper side in FIG. 1) of printed board 1 (in other words, in planar view of printed board 1), the whole region including a region overlapping electronic component 2, radiation vias 15 being disposed immediately below electronic component 2 and around electronic component 2. Thermal diffusion plate 31 is disposed in not the region overlapping region 1A, but other regions. Consequently, a part of the other main surface of printed board 1 (the main surface on the lower side in FIG. 1 opposite to the one of the main surfaces that is the upper main surface in FIG. 1) is bonded to the upper main surface of thermal diffusion plate 31, and another part of the other main surface of printed board 1 is bonded to the upper main surface of radiation member 32. However, the present invention is not particularly limited thereto.

Figure 3:
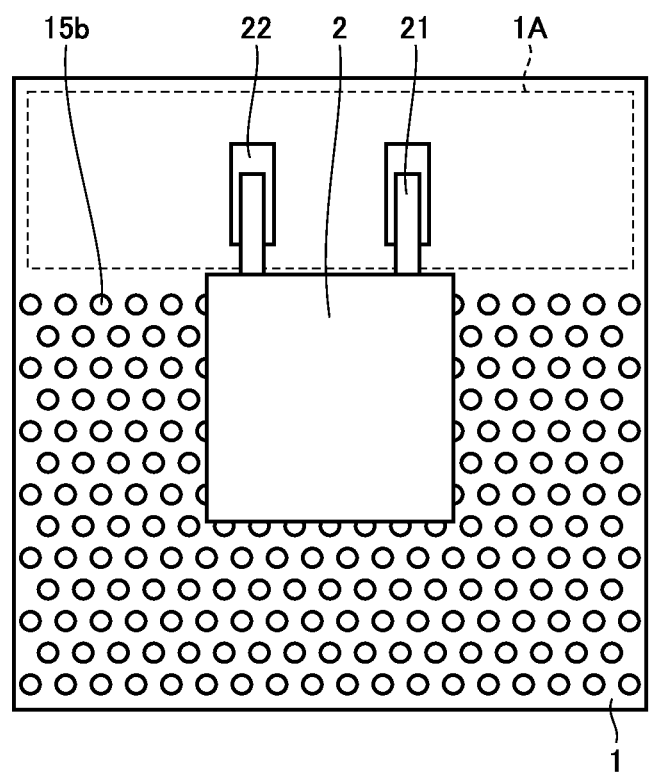
FIG. 3 is a schematic plan view illustrating an aspect in which an entire region in FIG. 1 is seen from a direction III indicated by an arrow in FIG. 1.

FIG. 2(A) is a schematic enlarged view of a laminated structure of printed board 1 and diffusion radiator 3, including electronic component 2, and FIG. 2(B) is an enlarged view illustrating a partial region S of printed board 1 and diffusion radiator 3 in FIG. 2(A), including electronic component 2. FIG. 3 illustrates a planar aspect of the whole region in FIG. 1 at a transmission viewpoint (planar view of FIG. 1) from the one main surface side of printed board 1.

Referring to FIGS. 2(A) and 2(B), printed board 1 includes an insulating layer 11. In the first embodiment, insulating layer 11 has a rectangular flat-plate shape. For example, preferably insulating layer 11 is made of glass fiber and epoxy resin. However, insulating layer 11 is not limited to glass fiber and epoxy resin, but may be made of aramid resin and epoxy resin, for example.

An upper conductor layer 12 is formed on one of main surfaces (upper main surface) of insulating layer 11, and a lower conductor layer 13 is formed on the other main surface (lower main surface) of insulating layer 11. An internal conductor layer 14 is formed in insulating layer 11. Internal conductor layer 14 is disposed so as to be vertically separated from upper and lower conductor layers 12 and 13. Internal conductor layer 14 is opposed to upper and lower conductor layers 12 and 13 so as to be substantially parallel to upper conductor layer 12 and lower conductor layer 13. That is, internal conductor layer 14 is opposed to both the main surfaces of insulating layer 11 so as to be substantially parallel to both the main surfaces. Two internal conductor layers 14 are formed in FIG. 2. However, the number of internal conductor layer 14 is not limited to two.

Printed board 1 (insulating layer 11) includes four conductor layers, that is, one upper conductor layer 12 on the one of the main surfaces, one lower conductor layer 13 on the other main surface, and two internal conductor layers 14 disposed between upper conductor layer 12 and lower conductor layer 13 are disposed as a plurality of conductor layers. All of conductor layers 12, 13, and 14 are spread (so as to be substantially parallel) along both the main surfaces of printed board 1. Conductor layers 12, 13, and 14 are made of a material having good thermal conductivity such as copper, and the thickness of each of conductor layers 12, 13, and 14 is about 100 μm. Conversely, printed board 1 includes a plurality of insulating layers 11 defined by conductor layers 12, 13, and 14.

Electronic component 2 is bonded to upper conductor layer 12 on the one of the main surfaces of printed board 1 using a bonding material 7a. For example, solder is preferably used as bonding material 7a. However, a conductive adhesive or a material having good thermal conductivity and electrical conductivity other than solder such as nano silver may be used.

On printed board 1, the plurality of radiation vias 15 are formed so as to penetrate from the one of the main surfaces to the other main surface of insulating layer 11. The plurality of radiation vias 15 are formed at intervals in the direction along both the main surfaces of printed board 1. Printed board 1 is considered while divided into a first region and a second region. The first region is a region overlapping electronic component 2 at a transmission viewpoint from the side of the one of the main surfaces of printed board 1, and the second region is a region around the first region, that is, a region disposed outside the first region at the transmission viewpoint from the side of the one of the main surfaces of printed board 1. At this point, the plurality of radiation vias 15 are classified into a first radiation via 15a formed in the first region and a second radiation via 15b formed in the second region. That is, radiation via 15 is formed in both the first region and the second region.

First radiation via 15a and second radiation via 15b are a hole made in a part of insulating layer 11, and a conductor film made of copper or the like is formed on an inner wall surface of the hole. In this case, radiation via 15 (first radiation via 15a and second radiation via 15b) may be considered to include both the hole and the conductor film inside the hole depending on the situation, or there is no particular problem even if radiation via 15 is considered to indicate only one of the hole and the conductor film. That is, in FIG. 2, first radiation via 15a and second radiation via 15b are a hole (hollow) except for the conductor film portion. However, first radiation via 15a and second radiation via 15b in FIG. 2 may be filled with a material having good thermal conductivity, for example, a conductive adhesive mixed with a silver filler or solder. In the latter, a member such as the conductive adhesive with which the hole is filled can be included in an element of radiation via 15. Radiation via 15 formed by filling radiation via 15 with the conductive adhesive can make the region made of the conductive member having thermal conductivity larger than that being hollow, and further contribute to the improvement of the heat radiation. The semiconductor device in which radiation via 15 is filled with solder will be described in a third embodiment (to be described later).

The above hole has a columnar shape having a diameter of, for example, 0.6 mm in planar view, and the thickness of the conductor film on the inner wall surface is, for example, 0.05 mm. The hole is not limited to the columnar shape, but may be a quadrangular prism or a polygonal shape at a transmission viewpoint from above.

First radiation via 15a and second radiation via 15b intersect both the main surfaces of printed board 1 so as to be, for example, orthogonal to both the main surfaces. Conductor layers 12, 13, and 14 are disposed so as to spread in a flat shape from the first region to the second region of printed board 1, and so as to be along both the main surfaces of printed board 1, namely, be substantially parallel to one another. For this reason, first radiation via 15a and second radiation via 15b are cross-connected to conductor layers 12, 13, and 14. Conversely, the plurality of conductor layers 12, 13, and 14 are cross-connected to each of the plurality of radiation vias 15. More specifically, the conductor film formed on the inner wall surface of the hole of radiation via 15 and conductor layers 12, 13, and 14 are cross-connected to each other.

Conductor layers 12, 13, and 14 may be disposed so as to spread in a planar manner over the whole region overlapping printed board 1 (exactly the region except for the region overlapping radiation via 15 in printed board 1). Preferably conductor layers 12, 13, and 14 are disposed at least in the region overlapping the region where radiation vias 15 are provided in the first and second regions (exactly the region sandwiched between a pair of radiation vias 15 adjacent to each other), and cross-connected to radiation vias 15. That is, the plurality of conductor layers 12, 13, and 14 may be disposed not in the region overlapping the region where radiation vias 15 are not formed, such as region 1A in FIG. 1, but only in the region overlapping the region where radiation vias 15 are provided (exactly the region sandwiched between the pair of radiation vias 15 adjacent to each other).

In FIGS. 1 and 2(A), the numbers of radiation vias 15 are not matched with each other. However, it is assumed that radiation vias 15 in FIGS. 1 and 2(A) correspond to each other. The same holds true for the following drawings.

Thermal diffusion plate 31 constituting diffusion radiator 3 is bonded to lower conductor layer 13 formed in printed board 1, thereby being bonded to the other main surface of printed board 1. The one of the main surfaces of thermal diffusion plate 31 in FIG. 1 (the main surface on the upper side in FIG. 2, and on the opposite side to radiation member 32) is bonded to lower conductor layer 13 by a bonding material 7b so as to close the holes in the region where pluralities of first radiation vias 15a and second radiation vias 15b are provided from below. Because the radiation via is not formed in region 1A, thermal diffusion plate 31 is not disposed. However, the present invention is not limited thereto. Solder is used as bonding material 7b. In the case that the solder is used as bonding materials 7a and 7b, an intermetallic compound is formed at a bonding interface between bonding materials 7a and 7b and each of electronic component 2, upper conductor layer 12, lower conductor layer 13, and thermal diffusion plate 31, and a contact thermal resistance can be reduced at the bonding interface. Preferably the solder is used as bonding materials 7a and 7b, but other materials having good thermal conductivity other than the solder such as a conductive adhesive and nano silver may be used.

As described later, thermal diffusion plate 31 has a function of diffusing the heat from electronic component 2 to the outside of electronic component 2 (to the second region side). Additionally, preferably thermal diffusion plate 31 has flexural rigidity higher than that of printed board 1, namely, a large product of Young's modulus and geometrical moment of inertia. That is, thermal diffusion plate 31 is bonded to the other main surface of printed board 1 so as to transfer the heat from the side of printed board 1 downward and to diffuse the heat in the main surface direction, and thermal diffusion plate 31 is bonded to printed board 1 so as to enhance rigidity of a structure constructed with printed board 1 and thermal diffusion plate 31. As a result, printed board 1 is hardly deformed against external force such as fixing and vibration.

Preferably thermal diffusion plate 31 is made of copper having a thickness of, for example, 0.5 mm. This can enhance both the rigidity and the thermal conductivity (heat radiation). However, thermal diffusion plate 31 may be made of a ceramic material having good thermal conductivity, such as aluminum oxide or aluminum nitride having a metallic film of copper or the like formed on its surface, or a metallic material in which a copper alloy, an aluminum alloy, a magnesium alloy, or the like is plated with nickel or gold. The thickness of thermal diffusion plate 31 is not limited to 0.5 mm.

Preferably radiation member 32 is made of a material having electrical insulating properties and good thermal conductivity. Specifically, preferably radiation member 32 is formed by a sheet in which particles of aluminum oxide, aluminum nitride, or the like are mixed in silicone resin. This is because aluminum oxide or aluminum nitride has good thermal conductivity and an electrical insulating property. However, radiation member 32 may be grease or an adhesive instead of the sheet.

Cooling body 33 is a rectangular flat-plate shape member made of a metallic material having good thermal conductivity. For example, cooling body 33 may be a casing, a heat pipe, or a radiation fin. Specifically, for example, cooling body 33 is preferably made of aluminum. However, cooling body 33 may also be made of copper, an aluminum alloy, or a magnesium alloy. Cooling body 33 is disposed directly below radiation member 32. Consequently, cooling body 33 is thermally connected to printed board 1 and thermal diffusion plate 31 through radiation member 32. In other words, radiation member 32 is in close contact with one of the main surfaces (on the upper main surface) of cooling body 33, and thermal diffusion plate 31 is in close contact with one of the main surfaces (on the upper main surface) of radiation member 32 opposite to cooling body 33.

Basically, in the lower region of printed board 1 in the drawings, it is assumed that the lower member in the drawings comes into close contact with (covers) the upper member from below. As used herein, the term "close contact" means that it is bonded to at least a part of its surface. However, as illustrated in FIGS. 1 and 2, more preferably radiation member 32 covers the other main surface (the main surface on the lower side in the drawings, and opposite to the one of the main surfaces) of thermal diffusion plate 31. With this, the heat can successfully be transferred from thermal diffusion plate 31 to radiation member 32. The term of covering means that radiation member 32 is bonded to the whole surface of the other main surface.

In semiconductor device 101 of the first example of the first embodiment having the above components, radiation via 15 is hollow. A method for manufacturing the configuration in FIG. 2(A) when solder is used as bonding materials 7a and 7b will be described with reference to FIG. 4.

Referring to FIG. 4(A), solder paste 5a is printed in a region on upper conductor layer 12 in the first region, and in the region separated from the hole of first radiation via 15a 1 by at least 100 μm in a direction along the main surface of printed board 1. Preferably a plurality of patterns of solder paste 5a are formed into a dot shape in planar view.

Referring to FIG. 4(B), electronic component 2 is mounted on solder paste 5a, and a known heating reflow process is performed. Consequently, solder paste 5a melts and flows along the surface of upper conductor layer 12, and is formed as layered bonding material 7a. Bonding material 7a bonds electronic component 2 and upper conductor layer 12 together. As illustrated in FIG. 4(A), solder paste 5a is printed in the region separated from the hole of first radiation via 15a, which allows the solder to be prevented from invading into the hole of first radiation via 15a.

Referring to FIG. 4(C), on lower conductor layer 13 in both the first and second regions, solder paste 5a is printed in the region separated from the holes of first and second radiation vias 15a and 15b by at least 100 μm in the direction along the main surface of printed board 1.

Referring to FIG. 4(D), thermal diffusion plate 31 is mounted on solder paste 5a, and a known heating reflow process is performed. Consequently, solder paste 5a melts and flows along the surface of lower conductor layer 13, and is formed as layered bonding material 7b. Bonding material 7b bonds electronic component 2 and lower conductor layer 13 together. Also in this case, as illustrated in FIG. 4(C), solder paste 5a is printed in the region separated from the hole of first radiation via 15a, which allows the solder to be prevented from invading into the hole of first radiation via 15a.

Figure 4:
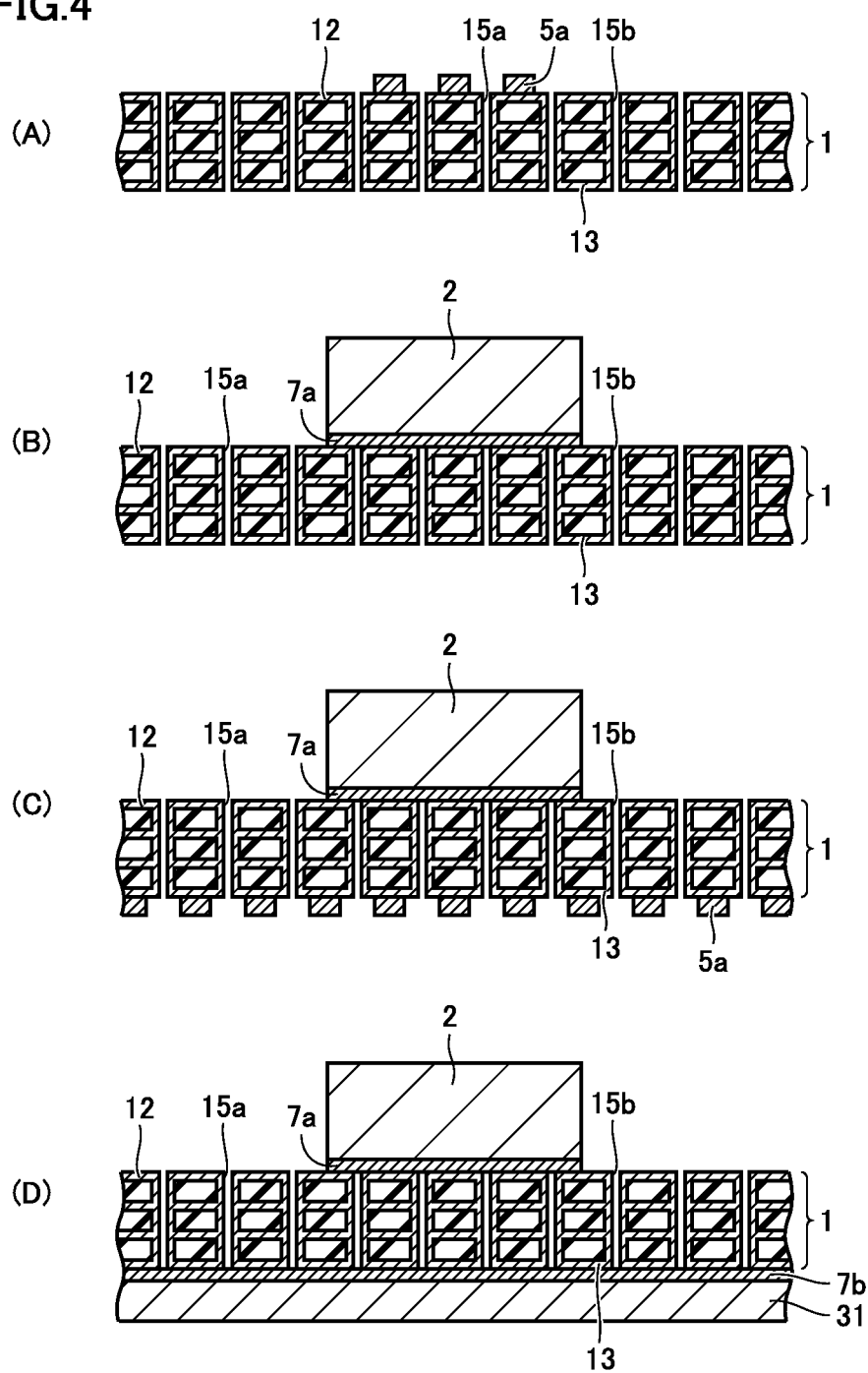
FIG. 4 is a schematic sectional view illustrating a first step (A), a second step (B), a third step (C), and a fourth step (D) of the method for soldering an electronic component and a thermal diffusion plate by making a radiation via of a printed board of the first embodiment hollow.
Figure 5A:
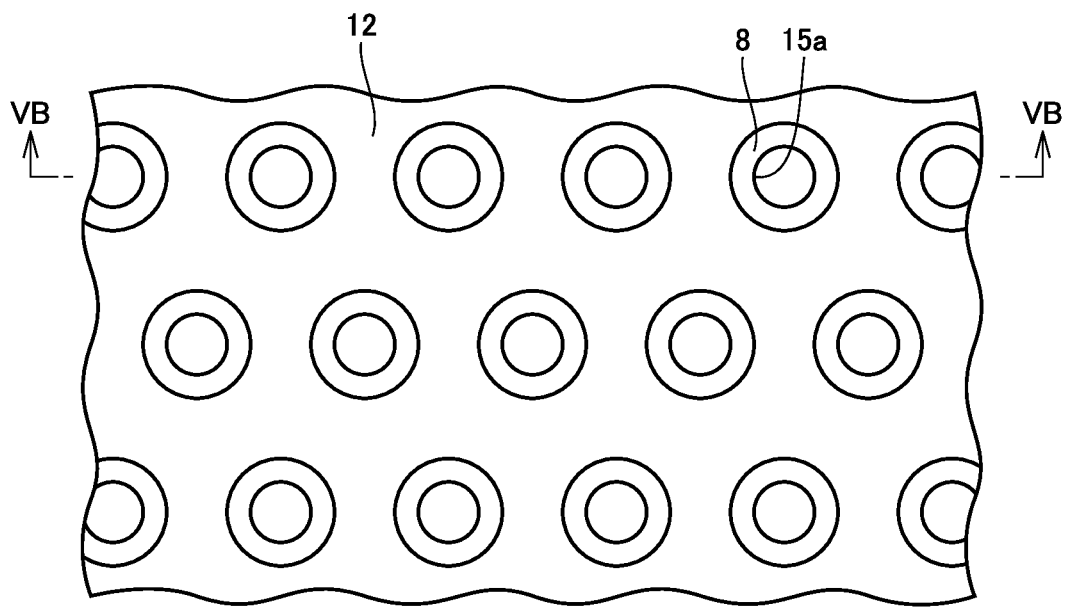
FIGS. 5(A) and 5(B) are a schematic plan view and a schematic sectional view illustrating projections of the first embodiment, which are formed on a conductor layer of the printed board in order to keep a thickness of a solder bonding layer bonding the electronic component and the thermal diffusion plate uniform.
Figure 5B:
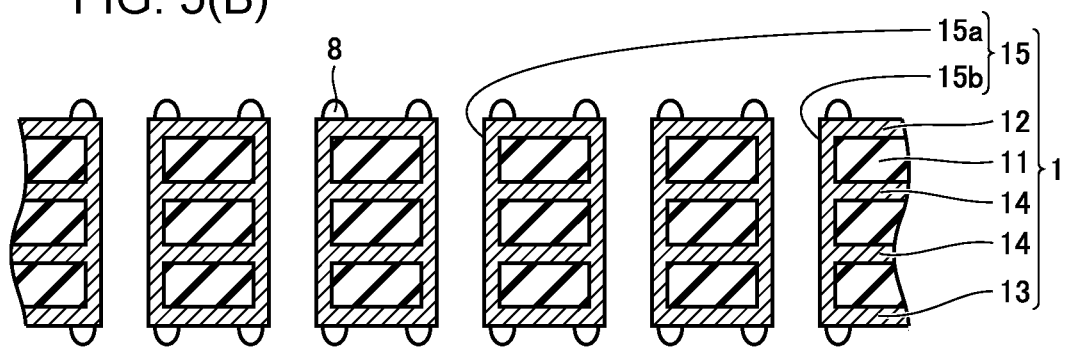

FIGS. 5(A) and 5(B) illustrate a method for manufacturing the configuration in FIG. 2(A) different from the method in FIG. 4. Referring to FIGS. 5(A) and 5(B), in the region adjacent to first and second radiation vias 15a and 15b in plan view on upper and lower conductor layers 12 and 13, for example, circular convex portions 8 are formed so as to surround first and second radiation vias 15a and 15b. For example, convex portion 8 is made of a solder resist. As a result, referring to FIG. 6 illustrating an example of the configuration in FIG. 2(A) manufactured using the process in FIG. 5, in printed board 1, convex portions 8 are formed as a first projection on upper and lower conductor layers 12 and 13.

Figure 6:
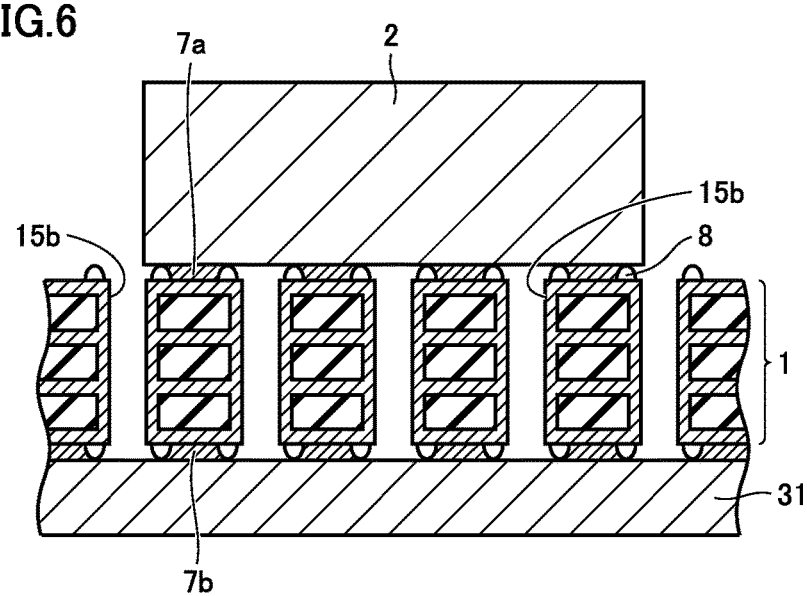
FIG. 6 is a schematic sectional view illustrating a bonding portion of the electronic component and the thermal diffusion plate, including the projections of the first embodiment in FIG. 5.

Referring to FIG. 6, solder paste 5a (see FIG. 4) is supplied to a region sandwiched between a pair of adjacent convex portions 8 on upper conductor layer 12, and electronic component 2 is mounted on solder paste 5a. Similarly, solder paste 5a (see FIG. 4) is supplied to a region sandwiched between a pair of adjacent convex portions 8 on lower conductor layer 13, and thermal diffusion plate 31 is placed on solder paste 5a. At this point, a known heating reflow process is performed, whereby solder paste 5a is formed as bonding material 7a bonding electronic component 2 and upper conductor layer 12 together and as bonding material 7b bonding lower conductor layer 13 and thermal diffusion plate 31 together.

When convex portion 8 is used as illustrated in FIGS. 5 and 6, convex portion 8 prevents a defect that solder paste 5a invades into the hole of first radiation via 15a.

Figure 7:
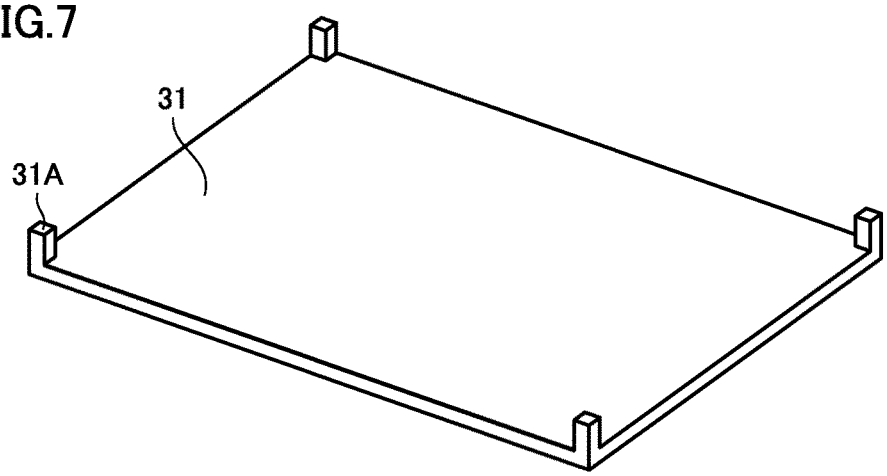
FIG. 7 is a schematic perspective view illustrating the thermal diffusion plate of the first example of the first embodiment.
Figure 8:
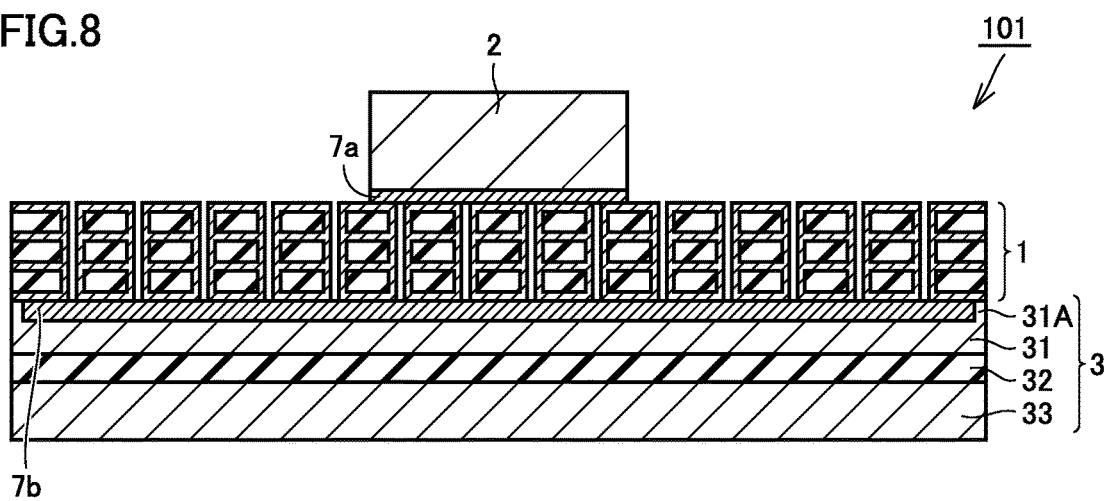
FIG. 8 is a schematic sectional view including the projections of the thermal diffusion plate taken along line VIII-VIII in FIG. 1.

FIG. 7 illustrates a whole aspect of thermal diffusion plate 31 of the first embodiment. FIG. 8 illustrates a sectional shape of semiconductor device 101 including thermal diffusion plate 31 in FIG. 7 in a range wider than that in FIG. 2(A) (over a whole depth direction in FIG. 1). Referring to FIG. 7, in semiconductor device 101 of the first embodiment, thermal diffusion plate 31 includes a plurality of projections 31A (second projections) extending upward (the side of printed board 1). Although projection 31A is formed in each of four corner portions of the rectangle, the installation location and the number of projections 31A are not limited thereto. In FIG. 7, the reason the shape at the transmission viewpoint from above is different from that in FIG. 1 is that thermal diffusion plate 31 is configured to overlap only the region except for region 1A in FIG. 1. Preferably projection 31A is basically made of the same material as the material of the main body of thermal diffusion plate 31.

Referring to FIG. 8, projection 31A is disposed so as to be in contact with an end of printed board 1, and bonding material 7b is supplied so as to be adjacent to projection 31A with respect to the direction along the main surface of printed board 1, whereby thermal diffusion plate 31 is bonded to (lower conductor layer 13 of) printed board 1.

Figure 9:
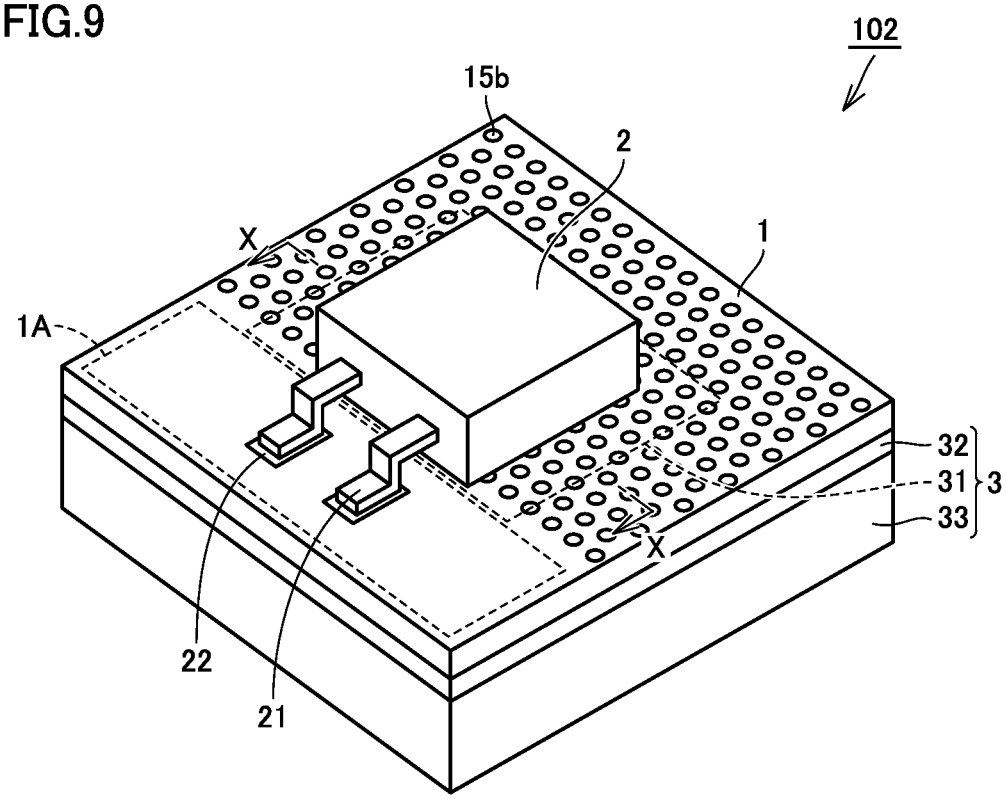
FIG. 9 is a schematic perspective view illustrating a semiconductor device according to a second example of the first embodiment.
Figure 10:
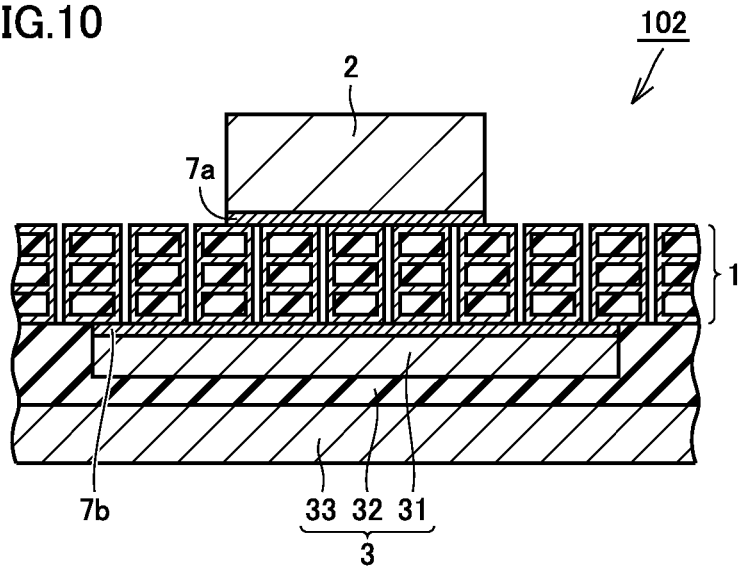
FIG. 10 is a schematic sectional view taken along line X-X in FIG. 9.

FIG. 9 illustrates an appearance aspect of a whole or part of a semiconductor device according to a second example of the first embodiment. FIG. 10 is a schematic enlarged view illustrating the laminated structure of printed board 1 and diffusion radiator 3 of the semiconductor device in FIG. 9, including electronic component 2. Referring to FIGS. 9 and 10, because a semiconductor device 102 of the second example of the first embodiment basically has the same configuration as that of semiconductor device 101, the detailed explanation will be omitted. However, thermal diffusion plate 31 is disposed so as to cover the whole of the region where first radiation via 15a of printed board 1 is formed and a part of the region where second radiation via 15b is formed from below. Semiconductor device 102 is different from semiconductor device 101 in this point. In semiconductor device 101, thermal diffusion plate 31 is disposed so as to cover the whole region where first and second radiation vias 15a and 15b are formed. Thermal diffusion plate 31 may cover at least the region where first radiation via 15a is provided. Accordingly, the term of "region where radiation via 15 is provided" means a part or whole (at least a part) of the region where radiation via 15 is provided.

Contrary to FIGS. 9 and 10, thermal diffusion plate 31 may have a size that is disposed over the whole of the region overlapping printed board 1 including the region including not only immediately below the region where first and second radiation vias 15a and 15b are formed, but also the region immediately below region 1A.

In both semiconductor device 101 in FIG. 1 and semiconductor device 102 in FIG. 9 of the first embodiment, at least radiation member 32 and cooling body 33 spread so as to overlap the whole of the region overlapping printed board 1 at a transmission viewpoint from above. That is, at least a part of diffusion radiator 3 spreads so as to overlap the whole of the region overlapping printed board 1 at a transmission viewpoint from above. However, as described above, thermal diffusion plate 31 may also be disposed over the whole region overlapping printed board 1, so that all the members constituting diffusion radiator 3 spread so as to overlap the whole of the region overlapping printed board 1 at the transmission viewpoint from above.

The effect of the semiconductor device of the first embodiment having the above configuration and an additional preferable configuration will be described below.

Figure 11A:
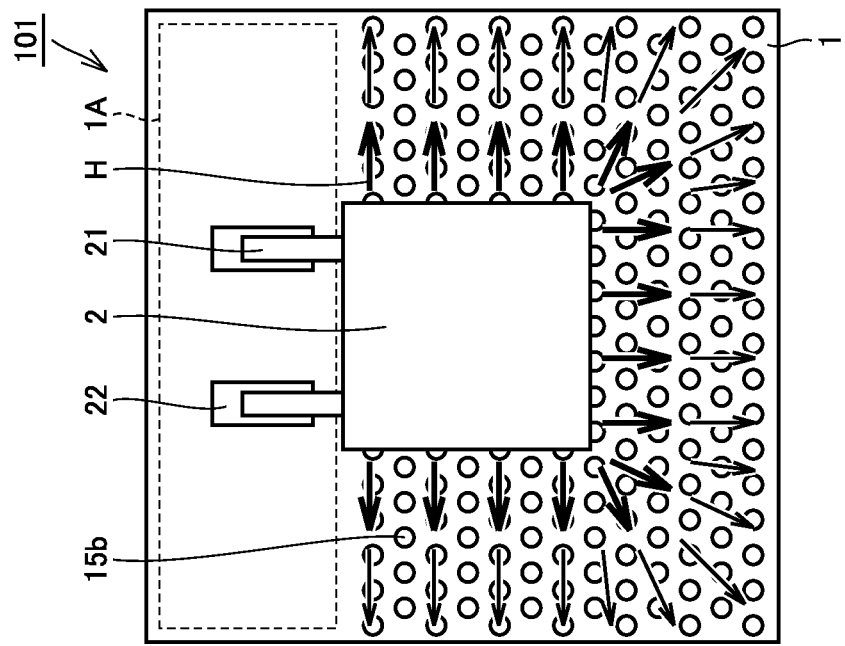
FIG. 11(A) is a schematic sectional view illustrating a heat transfer path in the semiconductor device of the first example of the first embodiment.
Figure 11B:
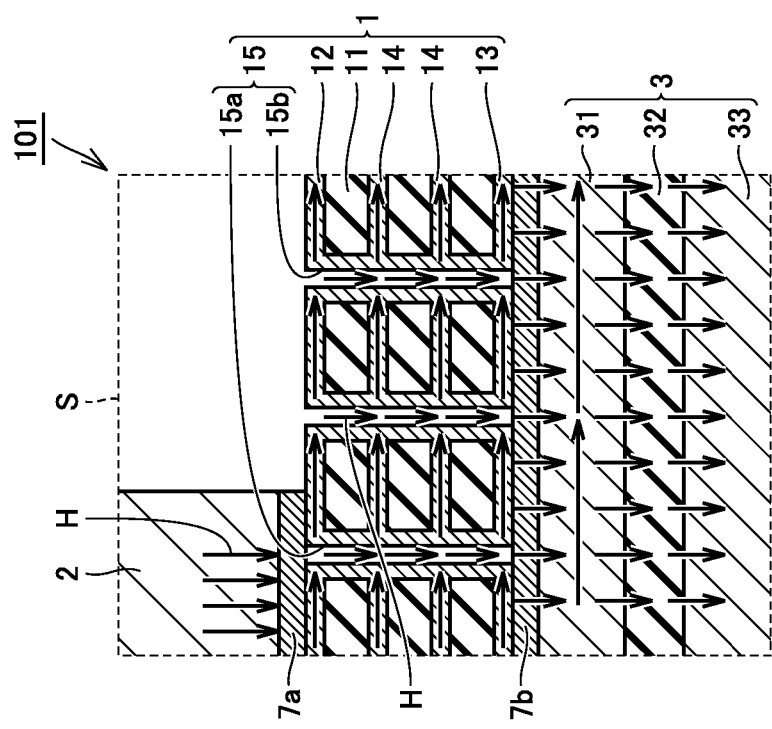
FIG. 11(B) is a schematic plan view illustrating the heat transfer path in the semiconductor device of the first example of the first embodiment.

FIG. 11(A) illustrates a thermal conduction path of semiconductor device 101 in the same region as region S illustrated in the enlarged sectional view of FIG. 2(B). FIG. 11(B) illustrates a thermal conduction path of whole semiconductor device 101 at the transmission viewpoint from above.

Referring to FIGS. 11(A) and 11(B), the heat generated from electronic component 2 by the drive of semiconductor device 101 is transferred downward (toward the side of diffusion radiator 3) through first radiation via 15a formed in printed board 1 below electronic component 2 as indicated by an arrow H in FIG. 11. Heat H also passes through upper conductor layer 12, lower conductor layer 13, or internal conductor layer 14, so that heat H diffuses radially toward the second region around (outside) electronic component 2 in FIG. 11(B). Then, a part of heat H that reaches the second region is conducted downward (toward the side of diffusion radiator 3) through second radiation via 15b. The reason the heat of electronic component 2 can be conducted to both the lower side (the side of diffusion radiator 3) and the outside (the second region side) is that radiation vias 15a and 15b extending in the direction crossing the main surface of printed board 1 and conductor layers 12, 13, and 14 spreading along the main surface are cross-connected to each other.

Heat H moved downward in printed board 1 reaches lower conductor layer 13 in both the region immediately below electronic component 2 and the region outside electronic component 2, and reaches diffusion radiator 3 bonded by bonding material 7b. Then, heat H is conducted downward through thermal diffusion plate 31, and conducted to cooling body 33 through radiation member 32 on the lower side of thermal diffusion plate 31. Although not illustrated, for example, heat H conducted to cooling body 33 is radiated to a water or air cooling mechanism provided on the lower side of FIG. 11(A). In thermal diffusion plate 31, heat H can radially be diffused so as to be separated from electronic component 2 (toward the second region) similarly to conductor layers 12, 13, and 14.

As described above, in semiconductor device 101 of the first embodiment, the heat generated from electronic component 2 is diffused from the first region to the second region by the conductor layer such as upper conductor layer 12 and thermal diffusion plate 31, whereby the heat is efficiently radiated to cooling body 33 through radiation member 32. In semiconductor device 101 of the first embodiment, radiation vias 15 are formed in both the first region and the second region. Consequently, not only the heat generated from electronic component 2 can be moved downward through first radiation via 15a in the first region immediately below electronic component 2, but also the heat diffused outward from electronic component 2 can be moved downward through second radiation via 15b in the second region. Heat H is radially diffused in printed board 1 by conductor layers 12, 13, and 14, which allows the heat to be moved from the first region to the second region. For this reason, the heat transferred to the second region can be radiated downward from second radiation via 15b.

Thermal diffusion plate 31 is bonded to the other main surface (lower conductor layer 13) that is the lowest portion of printed board 1. Consequently, heat H conducted to the other main surface (lower conductor layer 13) is efficiently transferred to thermal diffusion plate 31 as an outlet of heat H, which allows heat H to be efficiently radiated to the outside of semiconductor device 101. This effect is further enhanced by existence of diffusion radiator 3 including thermal diffusion plate 31, radiation member 32 bonded to thermal diffusion plate 31, and cooling body 33 (cooled by water or air).

Similarly to conductor layers 12, 13, and 14, thermal diffusion plate 31 can radially diffuse heat H in the first region immediately below electronic component 2 toward the second region side.

As described above, since the heat is radiated from both the first region and the second region to the outside, an area of the heat-radiating region is enlarged, and the effect that enhances the heat radiation is further increased. In the first embodiment, diffusion radiator 3 (at least radiation member 32 and cooling body 33) spreads so as to overlap the whole of the region overlapping printed board 1 in planar view. Consequently, a contact area between cooling body 33 and printed board 1 can sufficiently be increased, and the heat radiation can further be improved.

Figure 12:
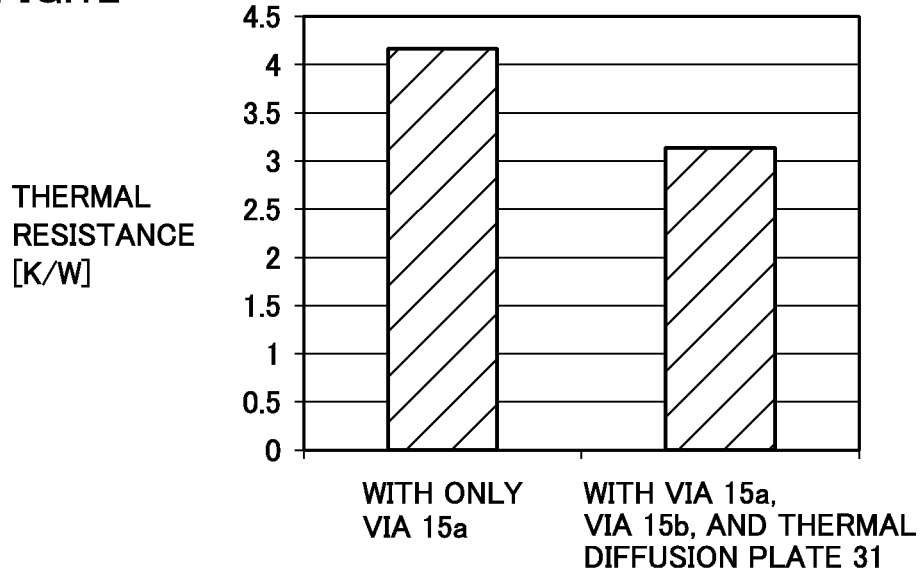
FIG. 12 is a graph in which thermal resistance values of the semiconductor device of the first embodiment and a semiconductor device of a comparative example are compared.

How much radiation efficiency is improved due to the existence of second radiation via 15b and thermal diffusion plate 31 will be described below with reference to FIG. 12. Specifically, a result that a radiation resistance in thermal conduction is considered using a thermal resistance value with respect to the configuration as semiconductor device 101 including second radiation via 15b and thermal diffusion plate 31 in addition to first radiation via 15a and the configuration as the comparative example not including second radiation via 15b and thermal diffusion plate 31 (but including only first radiation via 15a) is illustrated.

As used herein, the term of "thermal resistance" is an index representing difficulty of transmitting temperature, and means a temperature rise value per unit heating value. In semiconductor device 101 of the first embodiment, a thermal resistance ($R_{th}$) in the region in a vertical direction from electronic component 2 to cooling body 33 is given by the following expression (1). In the expression (1), $S_i$ (m$^2$) is a heat transfer area of each member, $l_i$ (m) is a thickness of each member, $\lambda_i$ (W/(m·K)) is thermal conductivity of each member, Q (W) is an amount of passing heating value, and $Th_i$ (K) and $Tl_i$ (K) are temperatures on high and low temperature sides.

[Mathematical Formula 1]

$$R_{th} = \sum \frac{l_i}{\lambda_i S_i} = \sum \frac{Th_i - Tl_i}{Q} \quad (1)$$

A model used to calculate a thermal resistance will be described below. A size of printed board 1 at the transmission viewpoint from above is 50×50 mm, and the thickness of printed board 1 is 1.3 mm. The size of electronic component 2 at the transmission viewpoint from above is 7×7 mm, and electronic component 2 is bonded to a central portion of printed board 1. That is, intervals between edges in viewing electronic component 2 from above and edges in viewing printed board 1 substantially parallelly opposed to the edges of electronic component 2 from above are substantially equal to each other. Upper conductor layer 12, lower conductor layer 13, and internal conductor layer 14 each have a thickness of 105 μm and constitute a four-layer structure (see FIG. 2). In printed board 1, 49 first radiation vias 15a are disposed immediately below electronic component 2 at equal intervals, and 217 second radiation vias 15b are disposed around first radiation vias 15a at equal intervals. First and second radiation vias 15a and 15b have a cylindrical shape, the hole of each of first and second radiation vias 15a and 15b has a diameter of 0.6 mm when viewed from above, and the conductor film on the inner wall surface of the hole has a thickness of 0.05 mm.

In the above model, thermal diffusion plate 31 of diffusion radiator 3 has a size of 50×35 mm at the transmission viewpoint from above and a thickness of 0.5 mm, and covers both first radiation via 15a and second radiation via 15b from below. Radiation member 32 has a dimension of 50×35 mm at a transmission viewpoint from above and a thickness of 0.5 mm.

In the above model, upper conductor layer 12, lower conductor layer 13, internal conductor layer 14, the conductor film on the inner wall surface of radiation via 15, and thermal diffusion plate 31 are made of copper, and have a thermal conductivity of 398 W/(m·K). Radiation member 32 has a thermal conductivity of 2.0 W/(m·K)

The model of semiconductor device 101 of the first embodiment and a model of a comparative example differ from each other only in the existence of second radiation via 15b and thermal diffusion plate 31, and the model of semiconductor device 101 and the model of the comparative example are identical to each other in other configurations including the above dimensions.

Using the above model, the thermal resistance value was simulated for semiconductor device 101 and the comparative example by thermal analysis software based on the expression (1). FIG. 12 illustrates the result. With reference to FIG. 12, second radiation via 15b and thermal diffusion plate 31 are provided like semiconductor device 101 of the first embodiment, which allows the thermal resistance to be reduced by about 25% compared with the comparative example in which second radiation via 15b and thermal diffusion plate 31 are not provided. Because the small thermal resistance means the high heat radiation, it can be seen from this result that the heat radiation is improved compared with the comparative example when second radiation via 15b and thermal diffusion plate 31 are provided like semiconductor device 101 of the first embodiment.

Figure 13:
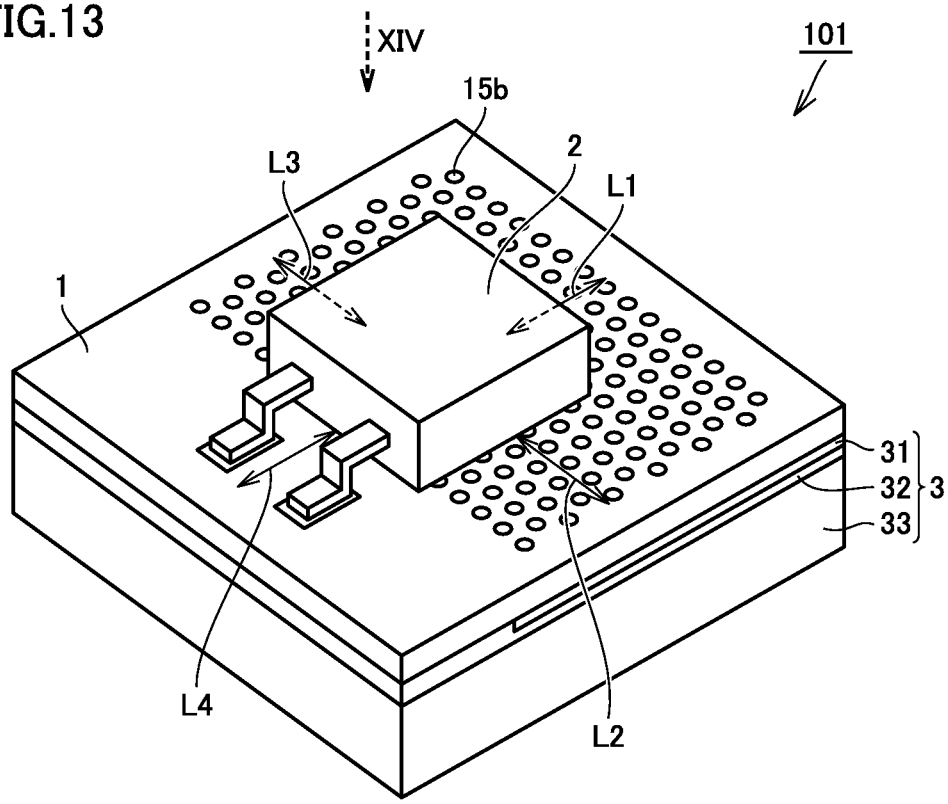
FIG. 13 is a schematic perspective view illustrating a model of the semiconductor device of the first embodiment, the model being used to derive the graph in FIG. 12.
Figure 14:
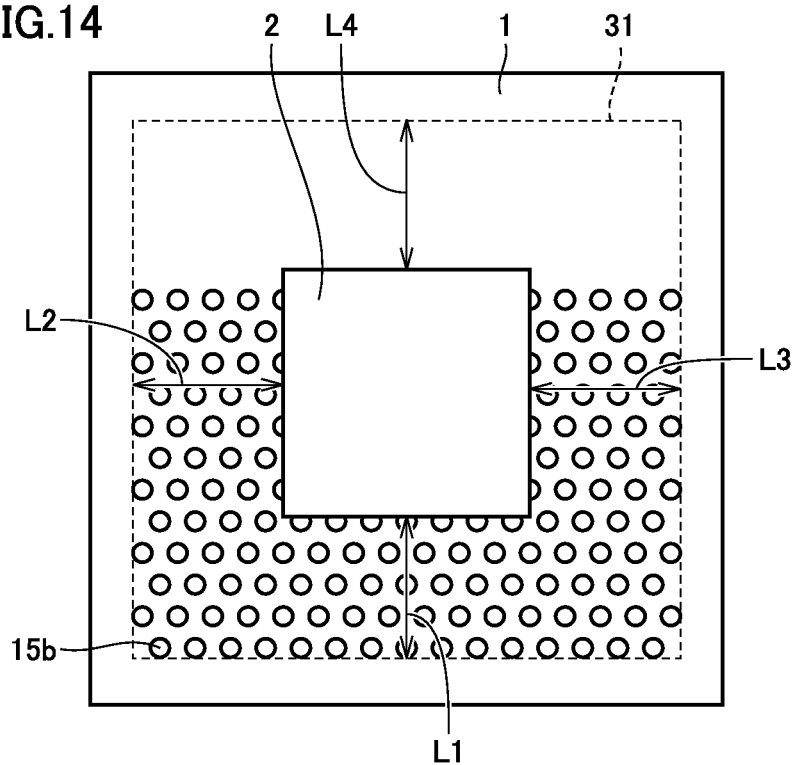
FIG. 14 is a schematic plan view illustrating the model of the semiconductor device of the first embodiment used to derive the graph in FIG. 12 when the model is seen from a direction XIV indicated by an arrow in FIG. 13.

A studying result of the region where radiation via 15 bonded to thermal diffusion plate 31 should be disposed will be described below with reference to FIGS. 13 to 15. FIGS. 13 and 14 basically illustrate the same model as the above model, and intervals between edges in viewing electronic component 2 from above and outermost portions of the second radiation vias 15b formed on respective edge sides of printed board 1 substantially parallelly opposed to the edges of electronic component 2 are indicated by L1, L2, and L3. As described above, in this model, because the intervals between the edges in viewing electronic component 2 from above and the edges of printed board 1 opposed to electronic component 2 are substantially equal to each other, distances L1 to L3 are substantially equal to one another. Basically, in semiconductor device 101, second radiation via 15b is not formed in region 1A (see FIG. 1), and second radiation via 15b does not exist on the side of a dimension L4 in FIGS. 13 and 14. However, dimension L4 is indicated as a reference in the same way as other directions.

Figure 15:
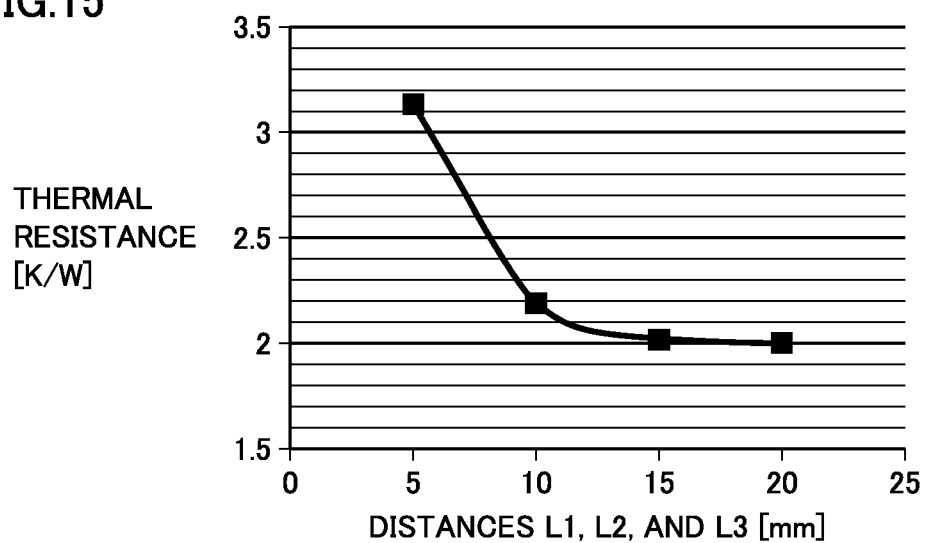
FIG. 15 is a graph illustrating a relationship between a distance from an edge of the electronic component to an outermost radiation via bonded to the thermal diffusion plate and a thermal resistance of the semiconductor device.

In a graph of FIG. 15, a horizontal axis indicates a distance from electronic component 2 to the outermost portion of second radiation vias 15*b* on the sides of three directions L1 to L3 where second radiation vias 15*b* are particularly formed, and a vertical axis indicates the thermal resistance value of semiconductor device 101 of each model. Referring to FIG. 15, with increasing dimensions of L1 to L3 (that is, with enlarging area where second radiation vias 15*b* are formed), the thermal resistance is decreased to improve the radiation efficiency. However, the decrease in thermal resistance value is saturated when the values of L1 to L3 become 20 mm, and the thermal resistance value does not change even if the values of L1 to L3 are further increased and even if radiation via 15 in the region where the values of L1 to L3 are greater than or equal to 20 mm and thermal diffusion plate 31 are bonded together.

Accordingly, thermal diffusion plate 31 preferably covers first radiation vias 15*a* in the first region of printed board 1 and the plurality of second radiation vias 15*b* formed in the region where the distance from the outermost portion of the first region is within 20 mm in the second region, and is bonded to radiation vias 15*a* and 15*b*.

Additionally, as illustrated in FIGS. 7 and 8, thermal diffusion plate 31 of the first embodiment includes projections 31A. Consequently, the thickness of bonding material 7*b* in FIG. 8 can be kept uniform, and heat transfer from lower conductor layer 13 to thermal diffusion plate 31 is evenly diffused toward the second region side in thermal diffusion plate 31. This enables the efficiency of heat radiation to be further enhanced.

In the first embodiment, second radiation via 15*b* is formed in not only the first region of printed board 1 but also the second region around the first region. Consequently, the mechanical rigidity of printed board 1 is reduced compared with the case that second radiation via 15*b* is not formed. However, flexural rigidity of the structure constructed with printed board 1 and thermal diffusion plate 31 becomes higher than that of single printed board 1 by bonding thermal diffusion plate 31 to lower conductor layer 13 on the other main surface of printed board 1. This enables the prevention of the deformation of printed board 1.

Second Embodiment

Figure 16:
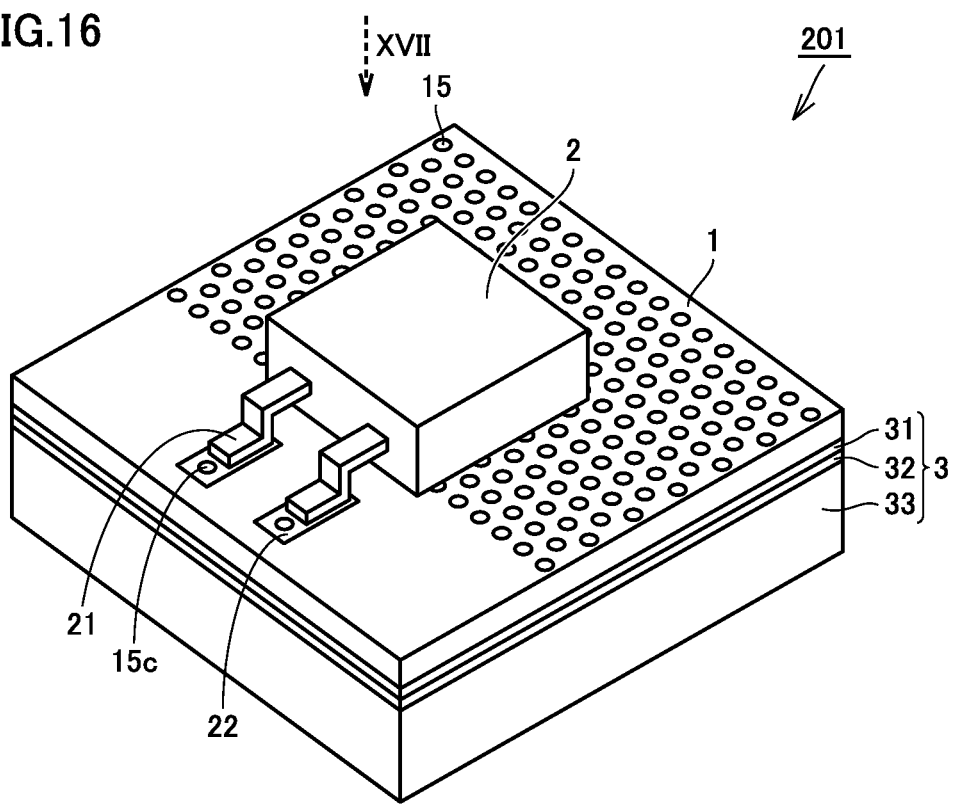
FIG. 16 is a schematic perspective view of a semiconductor device according to a second embodiment.
Figure 17:
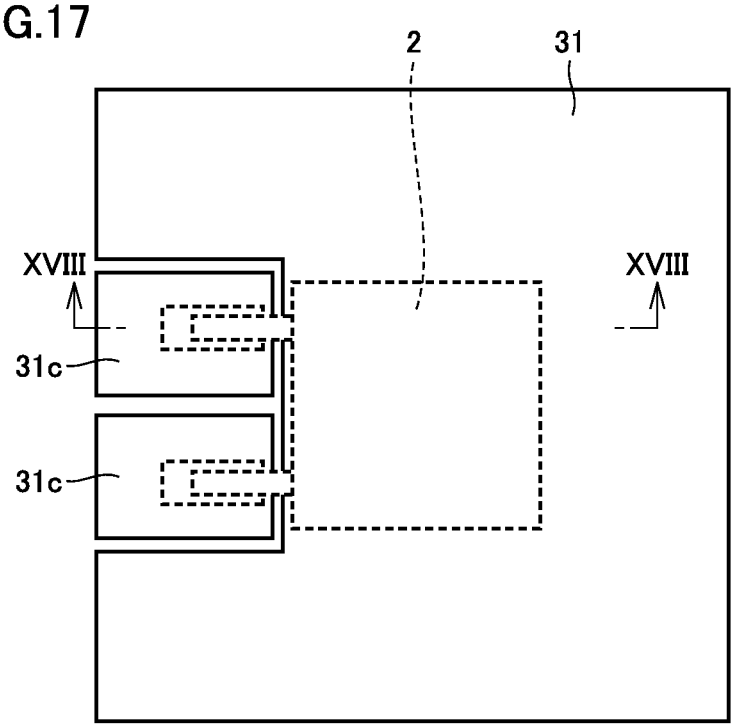
Figure 18:
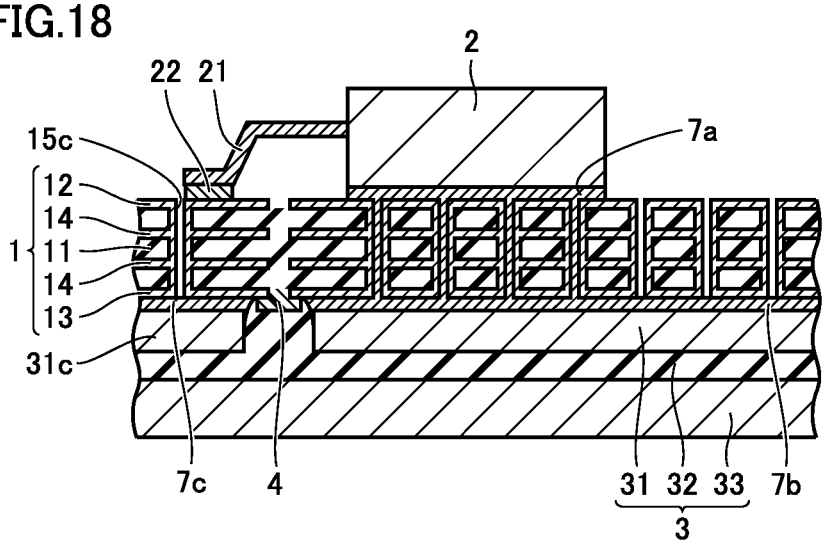
FIG. 18 is a schematic sectional view taken along line XVIII-XVIII in FIG. 17.

FIG. 16 illustrates an appearance aspect of a whole or part of a semiconductor device according to a second embodiment. FIG. 17 is a perspective view of a semiconductor device 201 in FIG. 16 when semiconductor device 201 is viewed from above as indicated by an arrow in FIG. 16. FIG. 18 is a sectional view for easily understanding features of the semiconductor device of the second embodiment. Referring to FIG. 16, because semiconductor device 201 of the second embodiment basically has the same configuration as that of semiconductor device 101 in FIG. 1, the same component is designated by the same reference numeral, and the overlapping description will be omitted. In semiconductor device 201, an electrode 22 connected to a lead terminal 21 of electronic component 2 is connected to a third radiation via 15*c*, but third radiation via 15*c* is not electrically connected to at least thermal diffusion plate 31 immediately below electronic component 2. That is, electrode 22 connected to lead terminal 21 is disposed so as to be adjacent to third radiation via 15*c* formed in the region, where radiation vias 15*a* and 15*b* are not formed because the region belongs to region 1A in semiconductor device 101. Consequently, electrode 22 is electrically connected to the conductor film in the hole of third radiation via 15*c*.

As illustrated in FIG. 17, in the second embodiment, a thermal diffusion plate 31*c* that is a part of thermal diffusion plate 31 is also disposed in the region belonging to region 1A of semiconductor device 101. This is because third radiation via 15*c* is also formed in region 1A.

As illustrated in FIG. 18, in semiconductor device 201, electrode 22 is not electrically connected to upper conductor layer 12, which is bonded to electronic component 2 using bonding material 7*a*. Lower conductor layer 13 connected to third radiation via 15*c* and lower conductor layer 13 connected to radiation vias 15*a* and 15*b* are electrically insulated by a solder resist 4. Because upper conductor layer 12 is partly separated with respect to the direction along the main surface, upper conductor layer 12 connected to third radiation via 15*c* and lower conductor layer 13 connected to radiation vias 15*a* and 15*b* are electrically insulated by insulating layer 11. That is, third radiation via 15*c* and electrode 22 are not electrically connected to the portion of thermal diffusion plate 31 immediately below lower conductor layer 13 connected to radiation vias 15*a* and 15*b*. The portion of thermal diffusion plate 31 immediately below lower conductor layer 13 connected to radiation vias 15*a* and 15*b* includes thermal diffusion plate 31 immediately below electronic component 2 (the portion overlapping electronic component 2 in planar view). Thermal diffusion plate 31*c* in FIG. 17 is separated from other portions, in particular, the portion of thermal diffusion plate 31 immediately below electronic component 2. Radiation member 32 has electrical insulation. Consequently, electrode 22 and third radiation via 15*c* are not electrically connected to thermal diffusion plate 31 (particularly, the portion disposed immediately below electronic component 2).

When electrode 22 and thermal diffusion plate 31 (in particular, the portion disposed immediately below electronic component 2) are electrically connected to each other, a disadvantageous short circuit occurs between electrode 22 and thermal diffusion plate 31. For this reason, when radiation via 15*c* is formed in region 1A, electrode 22 is not connected to at least thermal diffusion plate 31 immediately below electronic component 2. There is no particular problem with the electric connection between electrode 22 and thermal diffusion plate 31*c* in region 1A.

Thermal diffusion plates 31*c* are bonded to each other by a bonding material 7*c* (the same layer as bonding material 7*b*) made of solder. As described above, in the second embodiment, the heat from electronic component 2 can be radiated downward from not only radiation vias 15*a* and 15*b* but also radiation via 15*c* and lead terminal 21 connected to electrode 22, so that the heat radiation performance can be further improved compared with the first embodiment.

Third Embodiment

Figure 19:
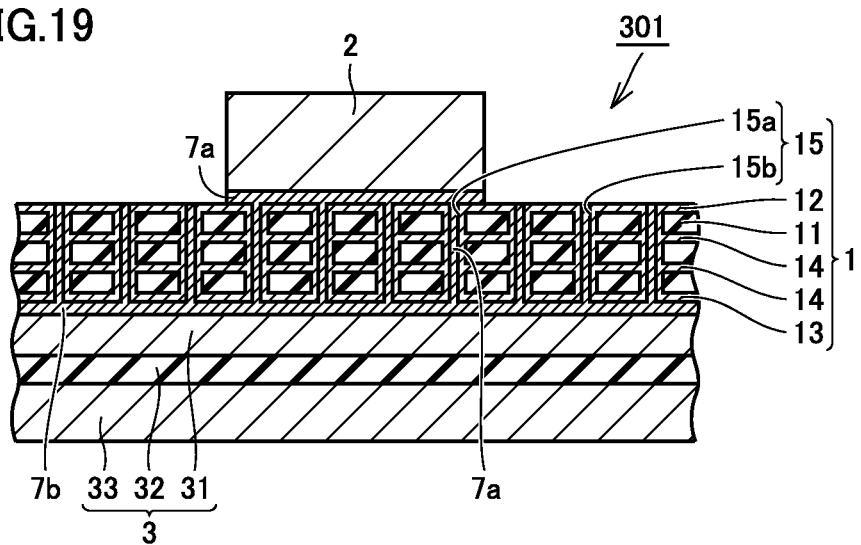
FIG. 19 is a schematic sectional view of a semiconductor device according to a first example of a third embodiment.

FIG. 19 is a schematic sectional view illustrating a portion corresponding to the portion in FIG. 2(A), that is, a portion corresponding to the portion taken along line IIA-IIA in FIG. 1 with respect to a semiconductor device according to a first example of a third embodiment. Referring to FIG. 19, because a semiconductor device 301 of the first example of the third embodiment basically has the configuration similar to that of semiconductor device 101 in FIG. 1, the same component is designated by the same reference numeral, and the overlapping description will be omitted. However, in semiconductor device 301, first and second radiation vias 15*a* and 15*b* are filled with the solder constituting bonding materials 7*a* and 7*b*. In this respect, semiconductor device 301 of the third embodiment is different from semiconductor device 101 in which the conductive material other than the conductor film on the inner wall surface is not disposed in the hole of first radiation via 15a or the like.

This configuration can increase the amount of heat transferred from electronic component 2 to the side of thermal diffusion plate 31 in first and second radiation vias 15a and 15b. Because the conductive member such as solder has thermal conductivity higher than that of the hollow, the inside of first radiation via 15a or the like is filled with solder and the area of the region having higher thermal conduction increases among sections that intersect with the extending direction of first radiation via 15a.

A method for manufacturing the configuration in FIG. 19 will be described with reference to FIG. 20. Referring to FIG. 20(A), a solder plate 5b is disposed on upper conductor layer 12 in the first region of printed board 1 while a flux for removing an oxide film of the solder is interposed therebetween. In particular, solder plate 5b is disposed on an electrode (not illustrated) in the first region of printed board 1. Solder plate 5b has a plane area approximately equal to that of the first region, and covers first radiation via 15a from just above. Preferably convex portions 8 similar to those in FIGS. 5 and 6 are formed on upper conductor layer 12 so as to surround solder plate 5b. A heat-resistant tape 6a made of polyimide adheres to lower conductor layer 13 (the lower side in the drawings) in the first region of printed board 1 and a part of the second region.

Referring to FIG. 20(B), electronic component 2 is mounted on solder plate 5b, and a known heating reflow process is performed. Referring to FIG. 20(C), solder plate 5b melts and flows along the surface of upper conductor layer 12, and first radiation via 15a is filled with solder plate 5b. This is because solder plate 5b is disposed so as to cover the hole of first radiation via 15a. Because convex portion 8 is disposed on upper conductor layer 12, melted solder plate 5b is prevented from invading into the second region that is the region outside convex portion 8. Because heat-resistant tape 6a adheres to lower conductor layer 13 in the first region, melted solder plate 5b does not leak to the lower side of heat-resistant tape 6a, but first radiation via 15a is filled with melted solder plate 5b. The region where solder plate 5b is disposed constitutes bonding material 7a of the solder similarly to the first embodiment.

Referring to FIG. 20(D), after the solder in first radiation via 15a is solidified, heat-resistant tape 6a is removed, and solder paste 5a is printed on lower conductor layer 13. However, solder paste 5a is printed in the wider region compared with the process in FIG. 4(C), and solder paste 5a may be printed so as to partially overlap first and second radiation vias 15a and 15b. Otherwise solder paste 5a may be printed in the region where the distance in the direction along the main surface of printed board 1 from the holes of first and second radiation vias 15a and 15b is less than or equal to 100 μm. Then, thermal diffusion plate 31 is mounted on solder paste 5a.

Referring to FIG. 20(E), at this point, a known heating reflow process is performed. Consequently, solder paste 5a melts and flows along the surface of lower conductor layer 13. Because solder paste 5a is printed so as to include the region overlapping the holes of first and second radiation vias 15a and 15b or the region adjacent to the holes of first and second radiation vias 15a and 15b, melted solder paste 5a wets upward the hole of second radiation via 15b. As a result, second radiation via 15b is filled with the solder.

Figure 20:
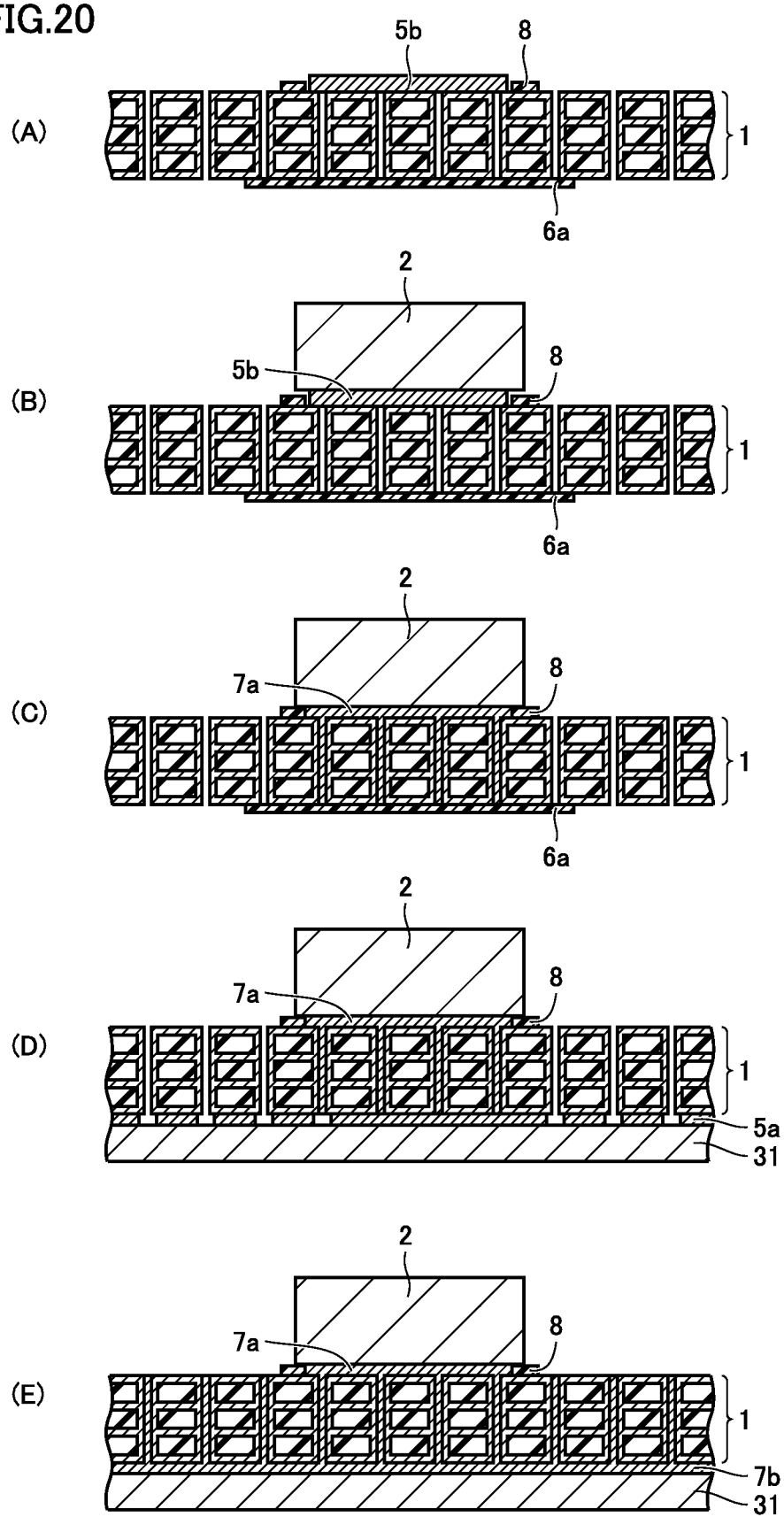
FIG. 20 is a schematic sectional view illustrating a first step (A), a second step (B), a third step (C), a fourth step (D) and a fifth step (E) of the method for soldering the electronic component and the thermal diffusion plate such that the radiation via of the printed board of the third embodiment is filled with solder.
Figure 21:
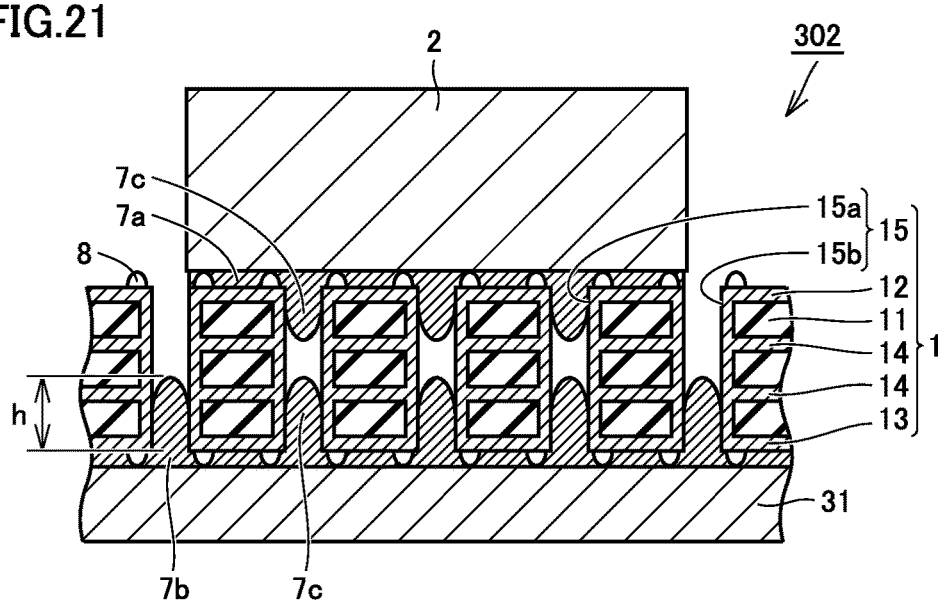
FIG. 21 is a schematic sectional view of a semiconductor device according to a second example of the third embodiment.

A semiconductor device 302 in FIG. 21 is substantially similar to semiconductor device 301 in FIG. 20, but differs from semiconductor device 301 in an aspect of solder filling radiation via 15. Specifically, referring to FIG. 21, in semiconductor device 302, only a part of the hole of radiation via 15 is filled with the solder constituting bonding material 7a. Specifically, in the holes of first and second radiation vias 15a and 15b, only the region relatively close to upper and lower conductor layers 12 and 13 is filled with the solder, but a central portion in the extending direction of radiation via 15 is not filled with the solder. In this respect, semiconductor device 302 is different from semiconductor device 301 in which the whole hole of radiation via 15 is filled with the conductor film of the inner wall surface and the solder.

When solder paste 5a or solder plate 5b is melted prior to a conductor film 9 on the inner wall surface of radiation via 15 in heating printed board 1 through the heating reflow process, the melted solder hardly flows along the inner wall surface of radiation via 15. As a result, the melted solder becomes a massive solder 7d to block radiation via 15, but a part of the region is not filled with the solder as shown in FIG. 21. When the amount of supplied solder is insufficient, a proportion of the solder disposed in radiation via 15 is reduced.

However, even in the aspect of FIG. 21, at least in the portion of massive solder 7d adjacent to upper and lower conductor layers 12 and 13, the section crossing the extending direction of radiation via 15 is filled with massive solder 7d, so that a proportion occupied by the solder having high thermal conductivity increases in section. Consequently, the heat radiation can be somewhat improved compared with the case that radiation via 15 is not filled with the solder at all like semiconductor device 101. The effect that improves the heat radiation is sufficiently obtained when massive solder 7d extending from the side of upper conductor layer 12 and massive solder 7d extending from the side of lower conductor layer 12 have a height h greater than or equal to ⅓ of a length of radiation via 15 in its extending direction. The same holds true for the case that block solder 7d extends only from one of the sides of upper and lower conductor layers 12 and 13. That is, preferably the solder exists in the plurality of radiation vias 15 closed by at least one of the main surfaces (upper side) of thermal diffusion plate 31 such that a volume greater than or equal to ⅓ of a volume of radiation via 15 is filled with the solder.

Figure 22A:
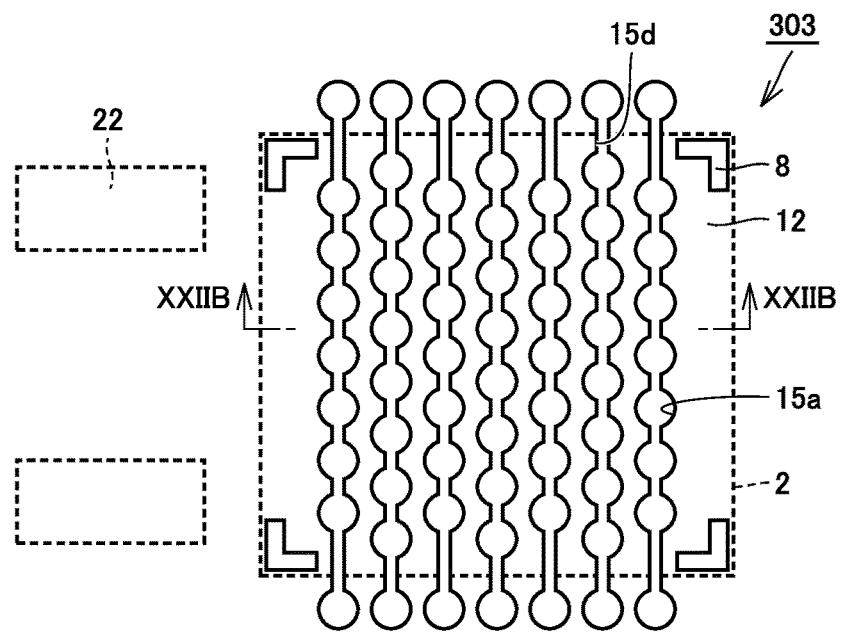
FIG. 22(A) is a schematic plan view illustrating a feature portion of a semiconductor device according to a third example of the third embodiment.
Figure 22B:
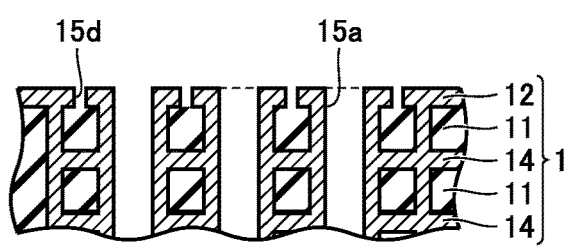
FIG. 22(B) is a schematic sectional view taken along line XXIIB-XXIIB in FIG. 22(A).

A semiconductor device according to a third example of the third embodiment will be described below with reference to FIG. 22. FIG. 22(A) illustrates, in particular, a planar aspect of first radiation via 15a in the first region of printed board 1 of a semiconductor device 303 of the third example of the third embodiment. FIG. 22 (B) is a schematic sectional view taken along line XXIIB-XXIIB in FIG. 22(A). Referring to FIGS. 22(A) and 22(B), in semiconductor device 303, in the region sandwiched between a plurality (in particular, one pair) of adjacent first radiation vias 15a in upper conductor layer 12, a groove 15d is formed so as to connect the holes of first radiation vias 15a. In this respect, semiconductor device 303 is different from semiconductor device 301 in which groove 15d is not formed. However, the configuration of semiconductor device 303 is basically similar to that of the semiconductor device 301 in other respects, and the overlapping description will be omitted.

Groove 15d can be formed by an ordinary photolithography technique and etching when upper conductor layer 12 of printed board 1 is patterned.

In semiconductor device 303, the provision of groove 15d can release air, which is expanded in first radiation via 15a due the heating for melting the solder during manufacturing, to the outside through groove 15d. Consequently, first radiation via 15a can easily be filled with the solder by preventing an increase in pressure of first radiation via 15a.

Figure 23:
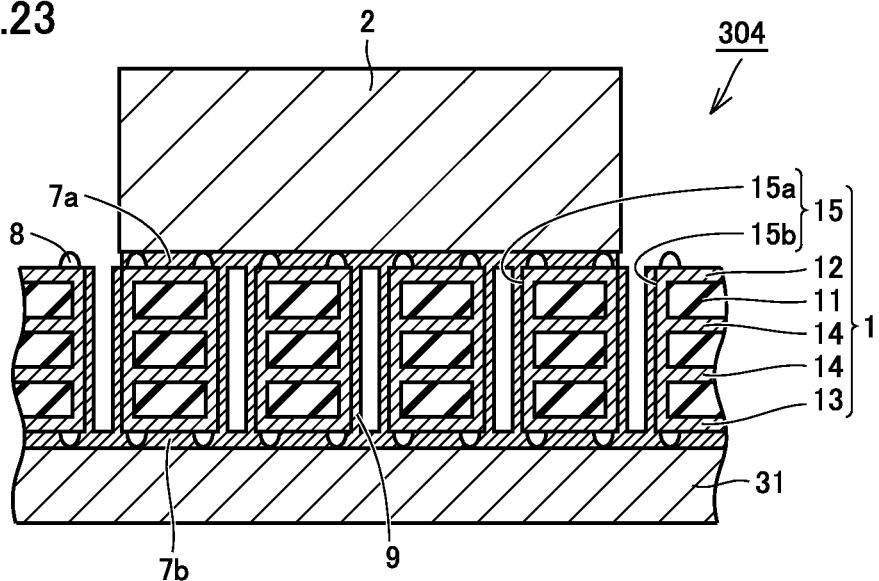
FIG. 23 is a schematic sectional view of a semiconductor device according to a fourth example of the third embodiment.

A semiconductor device according to a fourth example of the third embodiment will be described below with reference to FIG. 23. Referring to FIG. 23, a semiconductor device 304 of the fourth example of the third embodiment has a configuration basically similar to the configuration having convex portion 8 of the first embodiment in FIG. 6. However, in semiconductor device 304, conductor film 9 is formed thicker compared with FIG. 6 because the solder flows along conductor film 9 formed on the inner wall surface of the holes of first and second radiation vias 15a and 15b. As a result, the sectional area of the portion of conductor film 9, which has thermal conductivity higher than that of the hollow, in the sections intersecting the extending direction of first and second radiation vias 15a and 15b. Accordingly, in semiconductor device 304, the amount of heat transferred from electronic component 2 to the side of thermal diffusion plate 31 in first and second radiation vias 15a and 15b can be increased compared to the first embodiment.

The effect that increases the amount of heat transfer in radiation via 15 is sufficiently obtained when the volume of the solder in the hole (the amount of solder formed as conductor film 9) is greater than or equal to ⅓ of the volume in the hole of radiation via 15.

Fourth Embodiment

Figure 24A:
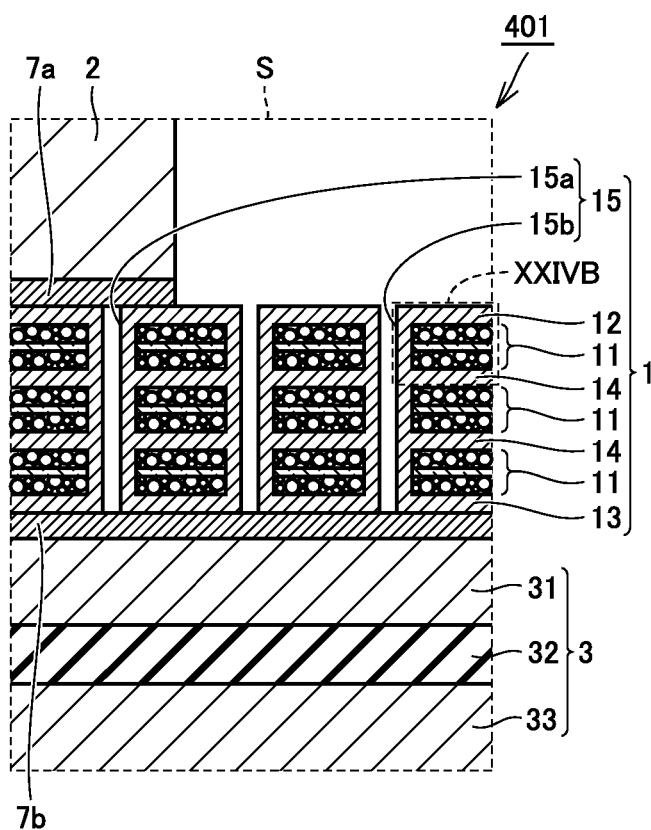
FIG. 24(A) is an enlarged schematic sectional view of region S surrounded by the dotted line in FIG. 2(A) in a fourth embodiment.
Figure 24B:
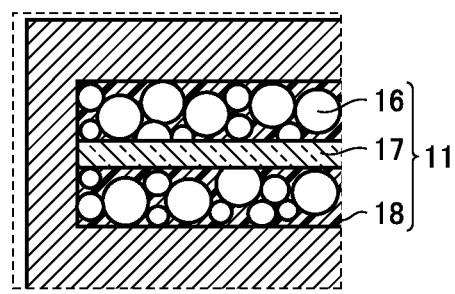
FIG. 24(B) is an enlarged schematic sectional view of a region XXIVB surrounded by a dotted line in FIG. 24(A).

FIG. 24(A) is an enlarged sectional view illustrating a configuration of the same region as region S in FIGS. 2(B) and 11(A) of the first embodiment in a semiconductor device according to a fourth embodiment. FIG. 24(B) illustrates a configuration of insulating layer 11 included in printed board 1 in FIG. 24(A). Referring to FIGS. 24(A) and 24(B), because a semiconductor device 401 of the fourth embodiment basically has the configuration similar to that of semiconductor device 101, the same component is designated by the same reference numeral, and the overlapping description will be omitted. However, semiconductor device 401 of the fourth embodiment is different from semiconductor device 101 in that insulating layer 11 of printed board 1 includes a filler 16. As illustrated in FIG. 24(B), insulating layer 11 includes glass fiber 17 and epoxy resin 18.

Filler 16 is an inorganic filler particle, and preferably an aluminum oxide particle is used as filler 16. However, the present invention is not limited thereto, and ceramic particles such as aluminum nitride or boron nitride may be used. Filler 16 may have a configuration in which several kinds of particles are mixed, and for example, aluminum hydroxide may be mixed with aluminum oxide. Consequently, the thermal conductivity and thermal resistance of insulating layer 11 can be improved. When containing filler 16 as the inorganic filler particle, insulating layer 11 can conduct the heat through filler 16. Consequently, the thermal conduction of insulating layer 11 can be increased, and the thermal resistance of printed board 1 can be decreased.

The thermal resistance value was simulated using the expression (1) and a model similar to that of the first embodiment with respect to semiconductor device 401 including printed board 1 constructed with insulating layer 11 containing 70 wt % of filler 16 of aluminum oxide. Except for the existence of filler 16, the model has the same size and configuration as those of the model of semiconductor device 101 of the first embodiment. As a result, it was found that the thermal resistance value can be further reduced by about 5% compared with semiconductor device 101 in FIG. 12.

In the fourth embodiment, in order to increase the radiation effect, it is necessary to increase packing density of filler 16 contained insulating layer 11. Specifically, preferably the packing density of filler 16 is increased up to 80 wt %. For this reason, a shape of filler 16 is not limited to a spherical shape as shown in FIG. 24(B), but may be a three-dimensional shape based on a polygon such as a tetrahedron or a hexagonal crystal.

In the fourth embodiment, the size of filler 16 with which insulating layer 11 is filled does not need to be kept uniform. That is, even if only the particles of a single kind of filler 16 are contained in insulating layer 11, filler 16 may be formed by mixing particles of several sizes. In this case, because small-size filler 16 enters the region sandwiched between the plurality of large-size fillers 16, insulating layer 11 can be filled with filler 16 with higher density. Consequently, the heat radiation of insulating layer 11 can be further improved.

Fifth Embodiment

Figure 25:
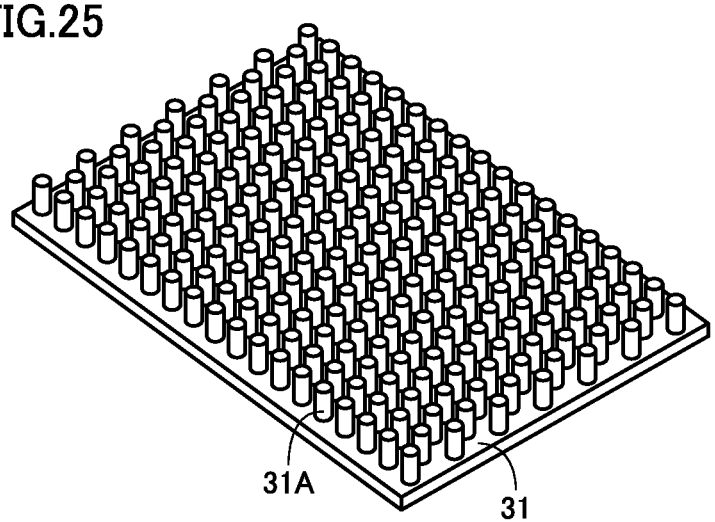
FIG. 25 is a schematic perspective view of a thermal diffusion plate according to a fifth embodiment.
Figure 26:
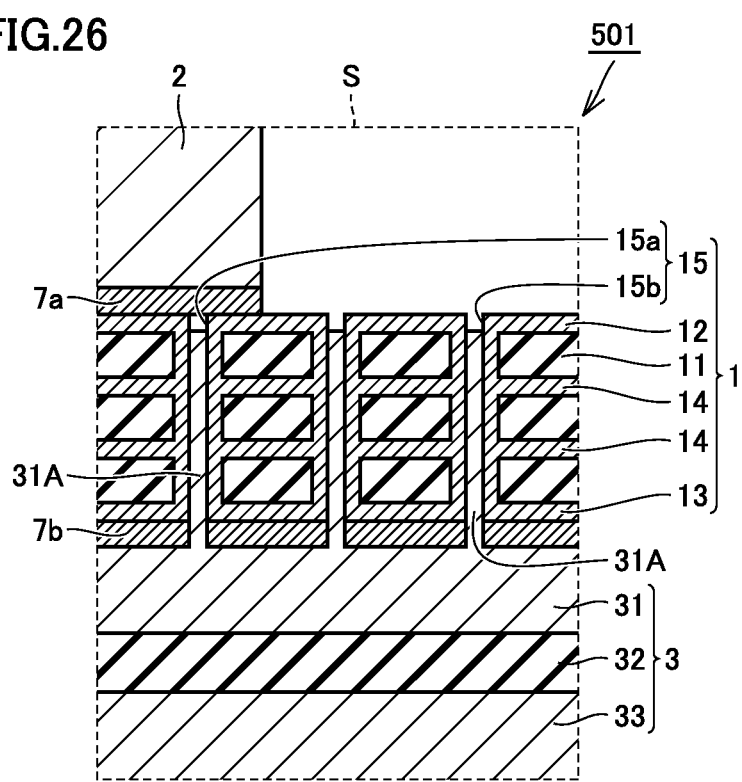
FIG. 26 is an enlarged schematic sectional view of region S surrounded by the dotted line in FIG. 2(A) in the fifth embodiment.

FIG. 25 illustrates a whole aspect of thermal diffusion plate 31 according to a fifth embodiment. FIG. 26 is an enlarged sectional view illustrating a configuration of the same region as region S in FIGS. 2(B) and 11(A) of the first embodiment in the semiconductor device of the third embodiment. Because a semiconductor device 501 of the fifth embodiment basically has the configuration similar to that of semiconductor device 101, the same component is designated by the same reference numeral, and the overlapping description will be omitted. However, referring to FIG. 25, thermal diffusion plate 31 of the fifth embodiment has a larger number of projections 31A compared with thermal diffusion plate 31 in FIG. 7 of the first embodiment, and projections 31A are formed as second projections over the substantially whole region overlapping first and second radiation vias 15a and 15b at a transmission viewpoint from above.

Referring to FIG. 26, each of the plurality of projections 31A formed on thermal diffusion plate 31 of the fifth embodiment is inserted and accommodated in the hole constituting corresponding one of the plurality of radiation vias 15 (first radiation vias 15a disposed in the first region and second radiation vias 15b disposed in the second region). Each of the plurality of projections 31A inserted in radiation via 15 adheres to (printed board 1 including) radiation via 15 by bonding material 7b such as solder or a conductive adhesive.

As described above, the holes of first and second radiation vias 15a and 15b can be filled with projections 31A made of a material having good thermal conductivity by inserting projections 31A in the holes of the plurality of first and second radiation vias 15a and 15b. For this reason, the amount of heat conducted through first and second radiation vias 15a and 15b is increased, and the thermal resistance can be reduced.

Projections 31A may be inserted in all radiation vias 15, and projections 31A may be inserted only in some of radiation vias 15. In the case that projections 31A are inserted only in some of radiation vias 15, preferably the size of the holes of radiation vias 15 in which projections 31A are inserted may be set larger than the size of holes of radiation vias 15 in which projections 31A are not inserted in planar view. Thus, the size of the holes of some of radiation vias 15 may be different from the size of the holes of other radiation vias 15 in planar view. In this case, projection 31A is easily inserted in the hole of radiation via 15 when thermal diffusion plate 31 is installed on the side of the other main surface of printed board 1, whereby workability can be improved in an assembling process.

In the fifth embodiment, the three-dimensional shape of projection 31A can be any shape such as a cylindrical shape, a conical shape, and a quadrangular pyramid shape according to the three-dimensional shape of radiation via 15. When the three-dimensional shape of projection 31A is appropriately changed in this way, projection 31A is easily inserted in the hole of radiation via 15, and the workability can be improved in the assembling process.

Sixth Embodiment

Figure 27:
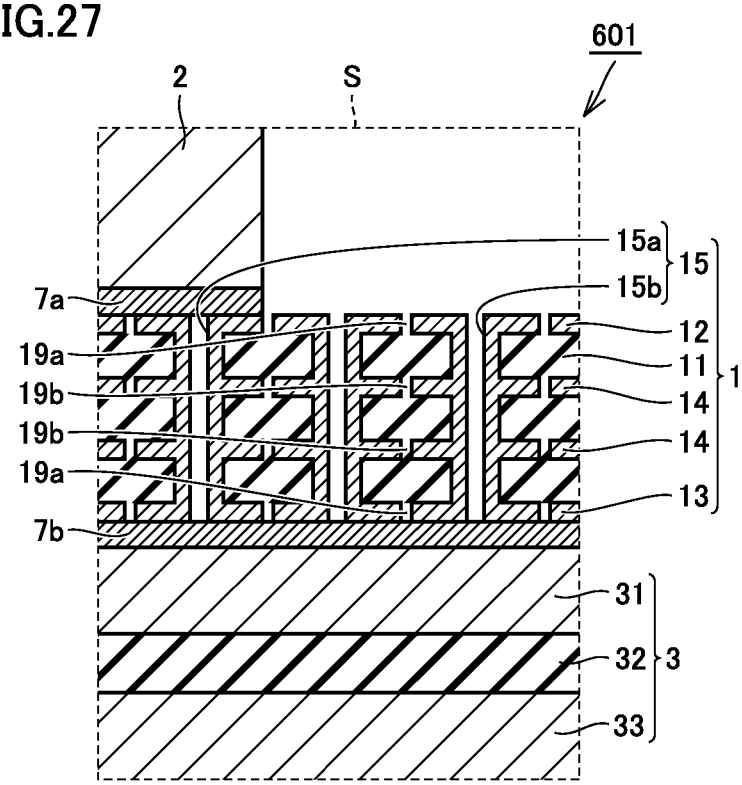
FIG. 27 is an enlarged schematic sectional view of region S surrounded by the dotted line in FIG. 2(A) in a sixth embodiment.

FIG. 27 is an enlarged sectional view illustrating a configuration of the same region as region S in FIGS. 2(B) and 11(A) of the first embodiment in a semiconductor device according to a sixth embodiment. Because a semiconductor device 601 of the sixth embodiment basically has the configuration similar to that of semiconductor device 101, the same component is designated by the same reference numeral, and the overlapping description will be omitted. However, referring to FIG. 27, in semiconductor device 601 of the sixth embodiment, each of the plurality of conductor layers 12, 13, and 14 includes a small hole 19 penetrating conductor layer 12, 13, or 14 from the side of one of the main surfaces (upper side) to the side of the other main surface (lower side) in the region between the pair of radiation vias 15 adjacent to each other in a left-right direction in FIG. 27 along both the main surfaces of printed board 1.

For example, preferably small hole 19 is formed in the center of a small portion of conductor layers 12, 13, and 14 sandwiched between the pair of adjacent radiation vias 15. However, the present invention is not limited thereto. For example, preferably small hole 19 is formed into a circular shape in planar view, and its diameter is about 100 μm. However, the present invention is not limited thereto. In FIG. 27, small hole 19 of upper conductor layer 12, small hole 19 of lower conductor layer 13, and small hole 19 of internal conductor layer 14 planarly overlap one another (such that the center positions of small holes 19 are substantially matched with one another). However, the present invention is not limited thereto, but a displacement may exist between the center positions. Small hole 19 can be formed by an ordinary photolithography technique and etching.

When small hole 19 is made in conductor layers 12, 13, and 14, water vapor generated from moisture contained in insulating layer 11 by the heating during the bonding of electronic component 2 or thermal diffusion plate 31 using solder can escape to the outside of printed board 1 through small hole 19. Consequently, peeling off of conductor layers 12, 13, and 14 from insulating layer 11 due to the increase in pressure inside insulating layer 11 can be prevented when the moisture of insulating layer 11 is vaporized. Accordingly, necessity of dehydration of printed board 1 is eliminated before electronic component 2 or thermal diffusion plate 31 is bonded using the solder, and semiconductor device 601 can be manufactured at low cost by reducing the number of steps.

The areas of conductor layers 12, 13, and 14 are reduced in planar view by making small hole 19, but a reduction ratio is small. The increase in thermal resistance is about 2% with respect to the direction along the main surfaces due to the area reduction of conductor layers 12, 13, and 14. Consequently, the amount of heat transferred from printed board 1 to diffusion radiator 3 by thermal conduction is equivalent to that of semiconductor device 101 of the first embodiment.

Accordingly, by making small hole 19, peeling off of conductor layers 12, 13, and 14 from insulating layer 11 can be prevented without affecting the radiation efficiency.

The features described in the above embodiments (examples included in the embodiments) may appropriately be combined within a range where technical contradiction is not generated.

It should be considered that the disclosed embodiments are an example in all respects and not restrictive. The scope of the present invention is defined by not the description above, but the claims, and it is intended that all modifications within the meaning and scope of the claims are included in the present invention.

REFERENCE SIGNS LIST

1: printed board, 2: electronic component, 3: diffusion radiator, 5a: solder paste, 5b: solder plate, 6a: heat-resistant tape, 7a, 7b, 7c: bonding material, 7d: massive solder, 8: convex portion, 11: insulating layer, 12: upper conductor layer, 13: lower conductor layer, 14: internal conductor layer, 15: radiation via, 15a: first radiation via, 15b: second radiation via, 15c: third radiation via, 15d: groove, 16: filler, 17: glass fiber, 18: epoxy resin, 19: small hole, 21: lead terminal, 22: electrode, 31: thermal diffusion plate, 31A: projection, 32: radiation member, 33: cooling body, 101, 102, 201, 301, 302, 303, 304: semiconductor device, H: heat

The invention claimed is:

1. A semiconductor device comprising:
   a printed board;
   an electronic component bonded on one of main surfaces of the printed board; and
   a diffusion radiator bonded onto an other main surface of the printed board on an opposite side to the one of the main surfaces, wherein
   the printed board includes an insulating layer having a plurality of radiation vias that connect the printed board from the one of the main surfaces to the other main surface in both a first region overlapping the electronic component at a transmission viewpoint from a side of the one of the main surfaces of the printed board and a second region disposed outside the first region at the transmission viewpoint from the side of the one of the main surfaces of the printed board,
   the printed board includes a plurality of conductor layers that are provided along both the main surfaces from the first region to the second region, and cross-connected to each of the plurality of radiation vias,
   the printed board further includes an electrode region disposed outside the first region at the transmission viewpoint from the side of the one of the main surfaces of the printed board,
   one of the plurality of conductor layers is disposed on the other main surface of the printed board,
   the diffusion radiator includes a thermal diffusion plate, a radiation member, and a cooling body,
   the radiation member is in close contact with one of main surfaces of the cooling body,
   the thermal diffusion plate having a main surface in close contact with one of main surfaces of the radiation member on an opposite side to the cooling body,
   the thermal diffusion plate having an other main surface on an opposite side to the main surface of the thermal diffusion plate, the other main surface of the thermal diffusion plate is bonded to the one of the plurality of conductor layers on the other main surface of the printed board so as to close the plurality of radiation vias formed in the first region and the plurality of radiation vias formed in the second region, wherein a terminal is connected to the electronic component, the terminal is bonded to an electrode located on the electrode region, the radiation member is disposed directly underneath the electrode region at the transmission viewpoint from the side of the one of the main surfaces of the printed board and the thermal diffusion plate does not overlap with the electrode region at the transmission viewpoint from the side of the one of the main surfaces of the printed board, and the printed board is connected to the cooling body via at least the radiation member, underneath the electrode region.

2. The semiconductor device according to claim 1, wherein the radiation member covers another main surface of the thermal diffusion plate on an opposite side to the one of the main surfaces of the thermal diffusion plate.

3. The semiconductor device according to claim 1, wherein

The electrode is connected to a radiation via of the plurality of radiation vias that is not connected to the thermal diffusion plate.

4. The semiconductor device according to claim 1, wherein solder exists in the plurality of radiation vias closed by the one of the main surfaces of the thermal diffusion plate such that a volume greater than or equal to ⅓ of a volume of the plurality of radiation vias is filled with the solder.

5. The semiconductor device according to claim 1, wherein the printed board includes the insulating layer comprising a plurality of insulating layers, and each of the plurality of insulating layers includes an inorganic filler particle.

6. The semiconductor device according to claim 1, wherein each of the plurality of conductor layers of the printed board includes a small hole penetrating each of the plurality of conductor layers from the side of the one of the main surfaces to a side of the other main surface in a region between a pair of radiation vias adjacent to each other, of the plurality of radiation vias, in a direction along both the main surfaces.

7. The semiconductor device according to claim 1, wherein the printed board includes projections on a conductor layer of the plurality of conductor layers located closest to the side of the one of the main surfaces in the plurality of conductor layers and on the one of the plurality of conductor layers located closest to the side of the other main surface in the plurality of conductor layers.

8. The semiconductor device according to claim 1, wherein the thermal diffusion plate has a plurality of second projections extending toward the printed board.

9. The semiconductor device according to claim 8, wherein the plurality of second projections are accommodated in respective holes of the plurality of radiation vias disposed in the first and second regions.

10. The semiconductor according to claim 1, wherein a flexural rigidity of the thermal diffusion plate is higher than a flexural rigidity of the printed board.

11. The semiconductor according to claim 1, wherein
the radiation member is bonded to the printed board underneath the electrode region.

12. The semiconductor according to claim 1, wherein the thermal diffusion plate includes a metallic material or a ceramic material, the radiation member includes a material having electrical insulating properties, and the cooling body includes a metallic material.

13. The semiconductor according to claim 1, wherein the thermal diffusion plate is thinner than the cooling body.

\* \* \* \* \*